United States Patent

Tomita

(10) Patent No.: US 6,442,092 B1
(45) Date of Patent: Aug. 27, 2002

(54) INTERFACE CIRCUIT AND METHOD FOR WRITING DATA INTO A NON-VOLATILE MEMORY, AND SCAN REGISTER

(75) Inventor: Shozo Tomita, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/953,166

(22) Filed: Sep. 17, 2001

Related U.S. Application Data

(62) Division of application No. 09/605,760, filed on Jun. 28, 2000, now Pat. No. 6,324,096.

(30) Foreign Application Priority Data

Sep. 9, 1999 (JP) .......................................... 11-255750

(51) Int. Cl.[7] .................................................. G11C 7/00
(52) U.S. Cl. ..................................... 365/219; 365/240
(58) Field of Search ................................... 365/219, 220, 365/221, 240

(56) References Cited

U.S. PATENT DOCUMENTS

| | | | | |
|---|---|---|---|---|
| 5,220,281 A | * | 6/1993 | Matsuki ...................... | 714/727 |
| 5,477,493 A | * | 12/1995 | Danbayashi ................. | 365/201 |
| 5,937,423 A | | 8/1999 | Robinson ..................... | 711/103 |
| 5,938,782 A | * | 8/1999 | Kay ............................ | 365/201 |
| 6,137,738 A | | 10/2000 | Vorgert ....................... | 365/201 |

FOREIGN PATENT DOCUMENTS

| | | |
|---|---|---|
| JP | 8-147186 | 6/1996 |
| JP | 10-105456 | 4/1998 |

OTHER PUBLICATIONS

Kenneth P. Parker, "The Boundary–Scan Handbook," pp.1–34, Kluwer Academic Publishers (1992).

\* cited by examiner

*Primary Examiner*—Tan T. Nguyen
(74) *Attorney, Agent, or Firm*—Volentine Francos, PLLC

(57) ABSTRACT

An interface circuit providing serial access to a non-volatile memory in an integrated circuit has at least two memory-access scan registers and at least one selection scan register coupled in common to a data input terminal of the integrated circuit. These registers are also coupled through a multiplexer to a data output terminal of the integrated circuit. The memory-access scan registers receive serial data such as address data and data to be written in the non-volatile memory at the specified addresses. The selection scan register receives a code for selecting the memory-access scan registers. Serial access to the non-volatile memory is speeded up because the memory-access scan registers can be accessed individually.

3 Claims, 23 Drawing Sheets

FIG. 14

| INSTRUC-TION CODE | SELECTED SCAN REGISTER | |
|---|---|---|
| BYPASS | BP | |
| SCAN_N | SCN | |
| SCAN_BN | SCBN | |
| INTEST | SCBN | |
| | 0000 | PRF |
| | 0001 | FCR |
| | 0010 | SECADR |
| | 0100 | DR |

FIG. 17

| INSTRUC-TION CODE | SELECTED SCAN REGISTER | |
|---|---|---|
| BYPASS | BP | |
| SCAN_BN | SCBN | |
| INTEST | SCBN | |
| | 0000 | PRF |
| | 0001 | FCR |
| | 0010 | SECADR |
| | 0100 | DR |

FIG. 19

| INSTRUC-<br>TION CODE | SELECTED SCAN REGISTER |
|---|---|
| BYPASS | BP |
| SCAN_N | SCN |
| PROFILE | PRF |
| FCMD | FCR |
| SECADR | SECADR |
| DRRDWR | DR |

FIG. 22

| strage<3:0> | CAPACITY |
|---|---|
| 0000 | 32 KBYTES |
| 0001 | 64 KBYTES |
| 0010 | 128 KBYTES |
| ------------ | ------------------ |
| 1111 | |

FIG. 23

| sector<2:0> | SECTOR SIZE |
|---|---|
| 000 | 64 BYTES |
| 001 | 128 BYTES |
| 010 | 256 BYTES |
| ------------ | ------------------ |
| 111 | ------------------ |

INTERFACE CIRCUIT AND METHOD FOR WRITING DATA INTO A NON-VOLATILE MEMORY, AND SCAN REGISTER

CROSS REFERENCE TO RELATED APPLICATIONS

This is a divisional application of application Ser. No. 09/605,760, filed Jun. 28, 2000 now U.S. Pat. No. 6,324,096, which is hereby incorporated by reference in its entirety for all purposes.

BACKGROUND OF THE INVENTION

The present invention relates to an interface circuit and method for programming a non-volatile memory, and to a type of scan register useful in this circuit.

Non-volatile memory is a basic component of many integrated-circuit devices, including so-called 'system-on-a-chip' devices. Such devices often use a reprogrammable type of non-volatile memory, such as electrically erasable and programmable read-only memory (EEPROM), or flash memory (also referred to as flash ROM). Flash memory, which is electrically erasable in large blocks, is often used to store program code and parameter data in microcontroller chips, and in system-on-a-chip devices having a microcontroller core.

One advantage of flash memory in these devices is that it enables software changes to be implemented and tested with very short turn-around times, even enabling devices installed on printed-circuit boards to be reprogrammed in the field. For devices with large system programs, on-board reprogramming has become an essential capability, as it is virtually impossible to foresee all eventualities during the software design stage. Reprogrammability is useful for debugging, for customizing devices to user specifications, for updating parameters and other data stored in tables, and for extending the life cycle of a device or system through frequent software revisions.

To minimize the number of LSI terminals needed to implement the interface protocol, reprogramming is usually carried out through a serial interface circuit. Different manufacturers have used different serial interfaces, including the one described in IEEE Standard 1149.1-1990, which specifies a standard test access port and boundary-scan architecture. This interface standard is also known as JTAG revision 2.0, because of developmental work done by the Joint Test Action Group, and the associated technology is often referred to as JTAG technology.

Incidentally, LSI stands for large-scale integrated circuit, and IEEE for the Institute of Electrical and Electronics Engineers.

A device employing JTAG technology has a test access port (TAP) with a test data input terminal, a test data output terminal, and boundary scan circuits chained serially between these two terminals, enabling the input and output signals of the device to be observed and manipulated inside the device. If multiple devices of this type are mounted on the same printed-circuit board, their test access ports can be linked together to form a single boundary scan chain providing test access to all of the devices, enabling both internal device functions and interconnections between the devices to be tested.

Recently, JTAG technology has also been used as an interface for debugging the software of the microcontroller core of a system-on-a-chip, by providing a debugging scan chain, separate from the boundary scan chain, between the test data input and output terminals. It would be convenient if the same interface could also be used to program flash memory in the chip, so that debugging and reprogramming could be carried out in the same environment simply by connecting a debugger and a terminal device to the test access port, without the need for special equipment or wiring. Similarly, manufactured products could be programmed with customized software and then tested, using the same test access port for both purposes. A specialized flash-memory programming device, referred to below as a flash programmer, could also be connected to the test access port for on-board reprogramming in the field.

Aside from convenience, using the same test access port for debugging, programming, and testing is a way to reduce system costs.

A conventional way to enable on-chip flash memory to be programmed through the JTAG test access port is to provide a separate chain of memory-access registers between the test data input and output terminals. The memory-access register chain needs to include an address register for supplying address signals to the flash memory, a data register for storing read and write data, and a control register for supplying control signals to the flash memory. In the conventional scheme, these three registers are connected serially, the output data of one register becoming the input data of the next register in the chain.

A problem with the conventional memory-access register chain is that to read or write each word of flash-memory data, the associated address signals and control signals, as well as the data, must be shifted into or out of the memory-access registers. Input data destined for the register farthest from the test data input terminal must first be shifted through the other two registers. The total number of shift operations that must be performed per read or write access is therefore equal to the combined bit length of the address, data, and control registers.

The shift operations are synchronized with a test clock signal, which is supplied from the flash programmer or other host device that accesses the flash memory. The test clock frequency is limited, typically to one megahertz or less, because of the presence of electrical noise and other disturbing factors. The flash memory may have a capacity of several hundred kilobytes. Transferring this amount of data through a conventional register chain, with a test clock frequency of one megahertz or less, can easily take more than a minute. This delay is inconvenient during debugging, and intolerable in factory tests and inspections.

A further problem is that flash-memory storage capacity, sector size, and word width differ from one device to another. Consequently, the bit lengths of the address and data registers in the memory-access scan chain differ from one device to another. As new devices are constantly being developed, it is impractical to provide a flash programmer with pre-stored information describing the flash-memory parameters of every device that might need to be programmed. The alternative is to enter this information manually when the flash programmer is used, or to use different flash programmers for different types of devices, but both of these procedures are inconvenient and invite errors such as inadvertent entry of incorrect data or use of the wrong flash programmer.

An example of a conventional memory-access register chain and a more detailed description of these problems will be given later.

SUMMARY OF THE INVENTION

An object of the present invention is to speed up serial access to a non-volatile memory disposed in an integrated circuit.

Another object of the invention is to enable automatic set-up of a communication protocol between the integrated circuit and a programming device.

Yet another object is to increase the amount of parallel parameter data that can be captured and scanned out by a scan register.

The invented interface circuit comprises a plurality of memory-access scan registers coupled in common to a data input terminal of an integrated circuit in which the nonvolatile memory is disposed, receiving serial data related to access to the non-volatile memory from the data input terminal. The interface circuit also has at least one selection scan register coupled to the data input terminal, receiving a code selecting at least one of the memory-access scan registers, and has at least one multiplexer coupling the memory-access scan registers and selection scan register to a data output terminal of the integrated circuit, for serial output of data from these registers.

The memory-access scan registers include, for example, a data register storing data to be written in the non-volatile memory, an address register storing address information for the non-volatile memory, a function command register storing a code for controlling the non-volatile memory, and a profile register. The profile register captures parallel parameter data from the integrated circuit for serial output at the data output terminal. The parallel parameter data may include various parameters of the non-volatile memory.

The interface circuit may also have an instruction register to which instruction codes are provided from the data input terminal. Different memory-access scan registers may be detected by a different instruction codes, or all of the memory-access scan registers may be selected by a single instruction code. In the latter case, the selection scan register may receive different codes selecting the memory-access scan registers individually.

The above scan registers can be controlled by a test access port controller.

When the invented interface circuit is used for serial access to the non-volatile memory, the access is speeded up because each of the memory-access scan registers can be accessed individually, with no need to shift data through the other memory-access scan registers.

If parameters of the non-volatile memory are stored in a profile register, these parameters can be read from the data output terminal and analyzed to determine the bit lengths of the memory-access scan registers, whereby a protocol for communicating with the interface circuit can be set up automatically.

The invention also provides a scan register receiving serial scan input data and parallel capture data, and generating serial scan output data and update data, having a selector selecting the parallel capture data according to at least one bit of the update data. The amount of data that can be captured and scanned out is thereby increased. This type of scan register can be advantageously used as the above-mentioned profile register.

BRIEF DESCRIPTION OF THE DRAWINGS

In the attached drawings:

FIG. 14 summarizes the instruction codes used in the first embodiment;

FIG. 17 summarizes the instruction codes used in the second embodiment;

FIG. 19 summarizes the instruction codes used in the third embodiment;

FIG. 22 indicates how the storage capacity can be coded in FIG. 21;

FIG. 23 indicates how the sector size can be coded in FIG. 21; and

DETAILED DESCRIPTION OF THE INVENTION

Figure 1:
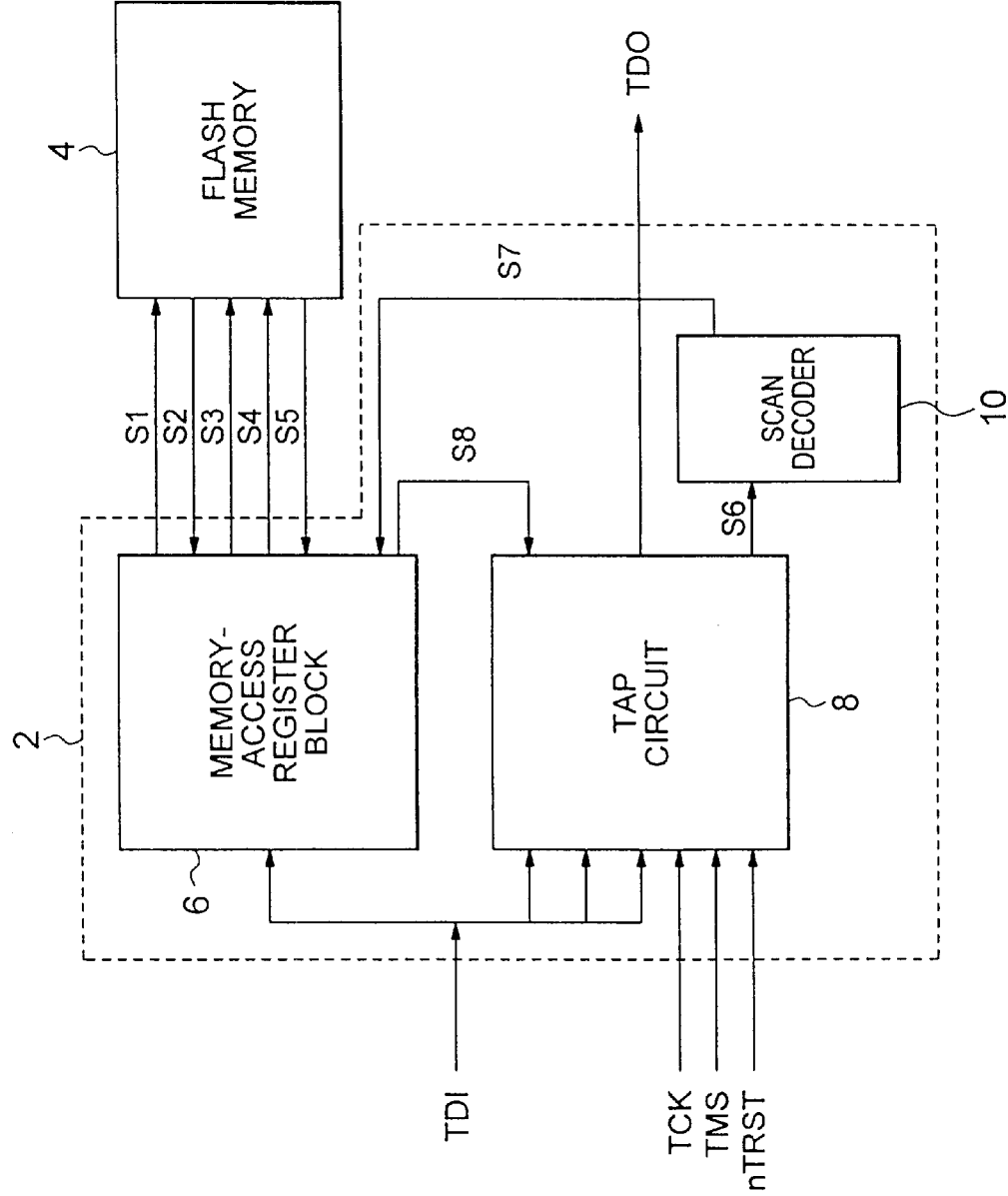
FIG. 1 is a block diagram showing an interface circuit illustrating a first embodiment of the invention.

Embodiments of the invention will be described with reference to the attached drawings, in which similar parts are indicated by similar reference characters.

Illustrating a first embodiment, FIG. 1 shows an interface circuit 2 that forms part of a large-scale integrated circuit chip. The core of the chip is a microcontroller unit (MCU) that executes a program stored in a flash memory 4. The MCU core and the signal lines connecting it to the flash memory 4 have been omitted to simplify the drawing. Also omitted are circuits implementing MCU debugging functions, and various other functions that may be integrated on the same chip.

The interface circuit 2 receives a Test Data In signal TDI, a Test Clock signal TCK, a Test Mode Select signal TMS and a Test Reset signal nTRST (n denotes negative logic) from corresponding external terminals (not visible) of the large-scale integrated circuit chip, and supplies a Test Data Out signal TDO to another external terminal (not visible) of the chip. The TDI, TDO, TMS, TCK, and nTRST terminals constitute the test access port or TAP of the chip, as specified in the IEEE 1149.1 standard. The interface circuit 2 and flash memory 4 communicate by signals denoted S1 to S5.

The interface circuit 2 comprises a memory-access register block 6, a TAP circuit 8, and a scan decoder 10. The memory-access register block 6 is coupled to the TDI terminal, and communicates with the flash memory 4 by means of signals denoted S1 to S5. The TAP circuit 8 is coupled to all five terminals of the test access port, and performs the usual functions specified in the IEEE 1149.1 standard, together with certain other functions related to flash memory access. For example, the TAP circuit 8 supplies an output signal S6 to the scan decoder 10, which in turn supplies a decoded signal S7 to the memory-access register block 6. The TAP circuit 8 also receives a multiplexed output signal S8 from the memory-access register block 6. Signal S7 selects the memory-access register block 6, enabling access to its registers, as will be described later. The scan decoder 10 also generates other signals (not visible) that select other registers and functions on the chip, such as a boundary scan register (not visible), and the above-mentioned MCU debugging functions.

Figure 2:
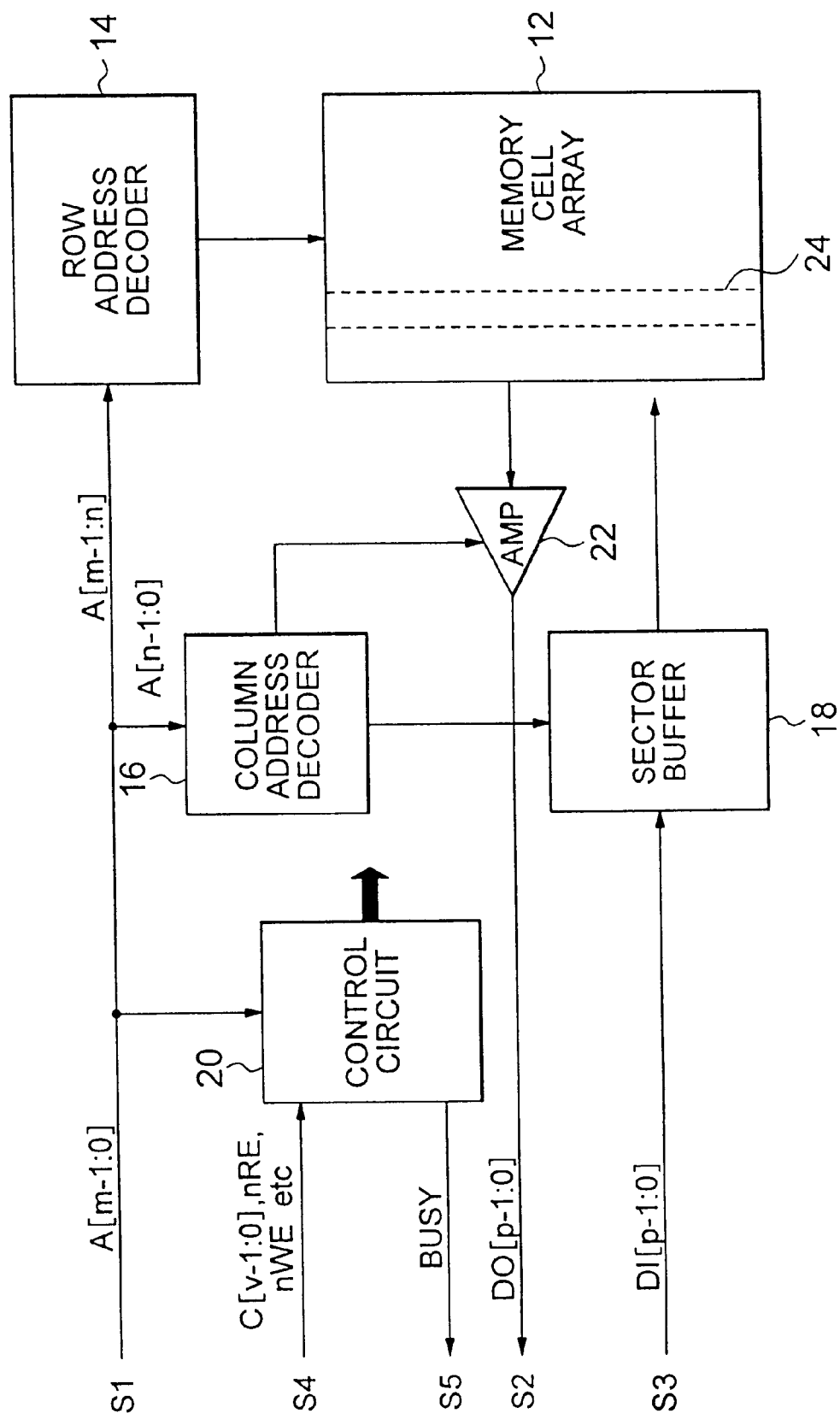
FIG. 2 is a block diagram of the flash memory in FIG. 1.

Referring to FIG. 2, the flash memory 4 comprises a memory cell array 12, a row address decoder 14, a column address decoder 16, a sector buffer 18, a control circuit 20, a plurality of sense amplifiers 22, only one of which is shown in the drawing, and other components, not directly relevant to the present embodiment, which have been omitted for simplicity.

The memory cell array 12 comprises a plurality of non-volatile memory elements (not visible) that can be programmed and erased electrically. These memory elements are organized into sectors and words, each sector comprising a plurality of words, each word comprising a plurality of memory elements. The row address decoder 14 selects a sector 24 to be read, programmed, or erased. In read access, the sense amplifiers 22 amplify signals from the memory elements in the selected sector 24, and the column address decoder 16 selects one word of amplified data for output. In programming, the sector buffer 18 temporarily stores the data to be programmed, each word being stored in a location selected by the column address decoder 16. When all necessary data have been stored in the sector buffer 18, all memory elements in the selected sector 24 in the memory cell array 12 are programmed simultaneously. In an erasing operation, an entire sector 24 is erased at once. The control circuit 20 controls all of these operations.

A word may comprise any fixed number of bits. For example, a word may correspond to one byte (eight bits), a plurality of bytes, or a fraction of a byte.

Signal S1 is an m-bit address signal A[m−1:0] received from the interface circuit 2. The n least significant bits A[n−1:01] are supplied to the column address decoder 16 as a word address code. The m−n most significant bits A[m−1:n] are supplied to the row address decoder 14 as a row or sector address code. All address bits are also supplied to the control circuit 20. The numbers m and n are positive integers (0<n<m).

Signal S2 is a p-bit data output signal DO[p−1:01], where p (another positive integer) is the number of bits per word. This signal is output to the interface circuit 2 from the sense amplifiers 22 selected by the column address decoder 16.

Signal S3 is a p-bit data input signal DI[p−1:0] received from the interface circuit 2 and supplied to the sector buffer 18.

Signal S4 is a multiple-bit control signal, including a v-bit control code C[v−1:0] (v being a positive integer), a read enable signal nRE, and a write enable signal nWE. These signals are received by the control circuit 20 from the interface circuit 2. The control code C[v−1:01] gives commands for various non-volatile memory operations such as sector write, read, program, and erase.

Signal S5 is a busy status signal supplied from the control circuit 20 to the interface circuit 2 to indicate that a non-volatile memory operation is in progress.

Figure 3:
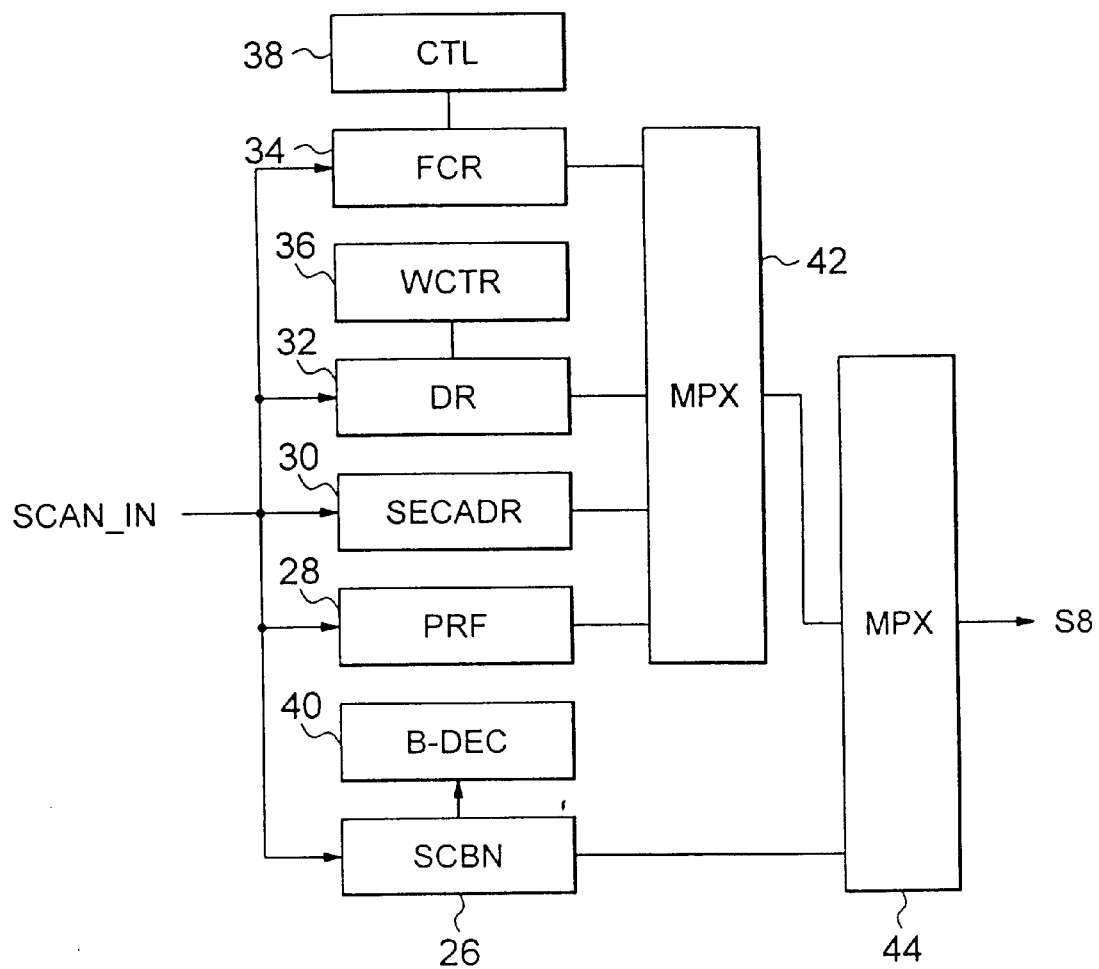
FIG. 3 is a block diagram of the memory-access register block in FIG. 1.

Referring to FIG. 3, the memory-access register block 6 comprises a scan branch register (SCBN) 26, a profile register (PRF) 28, a sector address register (SECADR) 30, a data register (DR) 32, a function command register (FCR) 34, a word counter (WCTR) 36, a control circuit (CTL) 38, a branch decoder (B-DEC) 40, and a pair of multiplexers (MPXs) 42, 44.

Figure 4:
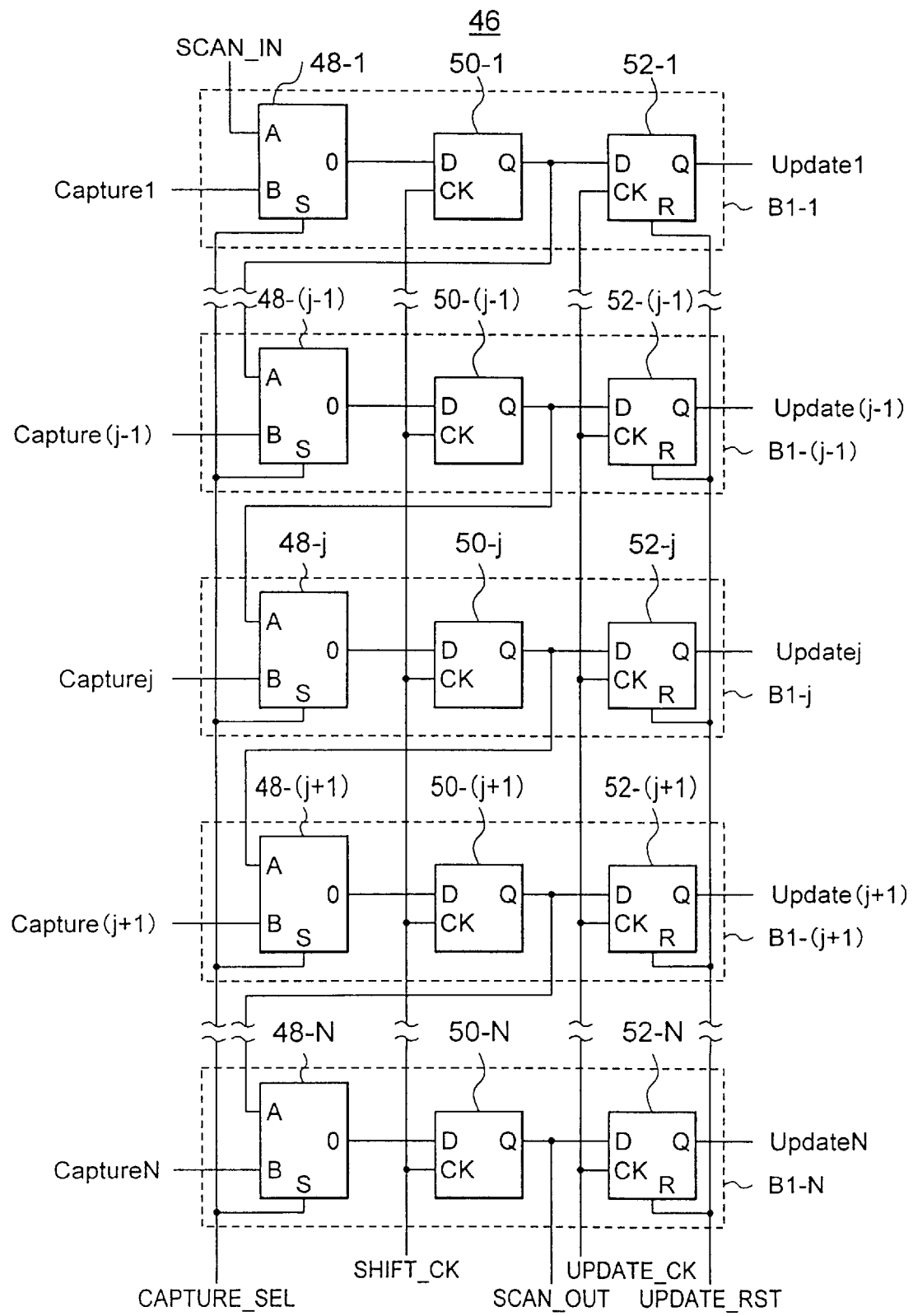
FIG. 4 is a circuit diagram of a generic scan register on which the scan registers in the first embodiment are based.

The scan branch register 26, the profile register 128, the sector address register 30, the data register 32, and the function command register 34 share a basic structure that is illustrated by a generic scan register 46 in FIG. 4. The generic scan register 46 is essentially a shift register with N bit stages, denoted B1-1 to B1-N, each storing one data bit. N may be any positive integer (1<N). Each bit stage B1-j (1<j<N) comprises a selector circuit 48-j and a pair of D-type flip-flops (D-FFs) 50-j, 52-j.

The operation of the generic scan register 46 is controlled by a capture select signal (CAPTURE_SEL), a shift clock signal (SHIFT_CK), an update clock signal (UPDATE_CK), and an update reset signal (UPDATE_RST). In each bit stage B1-j, CAPTURE_SEL is supplied to a selection (S) input terminal of the selector circuit 48-j, SHIFT_CK to a clock (CK) input terminal of the first D-FF 50-j, UPDATE_CK to a clock (CK) input terminal of the second D-FF 52-j, and UPDATE_RST to a reset (R) input terminal of the second D-FF 52-j (1<j<N).

Each selector has A and B input terminals. The A input terminal of the first selector circuit 48-1 receives a scan input signal SCAN_IN. The A input terminal of the other selector circuits 48-j (1<j) receive the Q output signal of D-FF 50-(j-1) in the preceding bit stage. The B input terminal of each selector circuit 48-j (1<j<N) receives a capture data bit (Capturej). Input A is selected when CAPTURE_SEL is at the '0' logic level, input B is selected when CAPTURE_SEL is at the '1' logic level, and the selected input is supplied from an output terminal O to the data input terminal D of the first D-FF 50-j in the same stage.

The first D-FF 50-j in each bit stage latches its D input in synchronization with SHIFT_CK, and supplies the latched data bit from its output terminal Q to the data input terminal D of the second D-FF 52-j. The output signals of D-FFs 50-1 to 50-(N-1) are also supplied to the selectors in the next stage, as described above, while the output of the last D-FF 50-N becomes a scan output signal (SCAN_OUT). The selectors 48-j and D-FFs 50-j (1≦j≦N) form a shift register.

The second D-FF 52-j in each bit stage latches its D input in synchronization with UPDATE_CK, and supplies the latched data bit from its output terminal Q as one bit of update data (Updatej). These D-FFs 52-j form a parallel update latch. Input of an UPDATE_RST signal resets the update data to the '0' logic level.

A capture operation is carried out by setting CAPTURE_SEL to the '1' logic level and supplying a SHIFT_CK pulse, causing the selectors 48-j to select the capture data and the D-FFs 50-j to latch the N capture data bits (Capture1 to CaptureN) in parallel.

A shift operation is carried out by setting CAPTURE_SEL to the '0' logic level and supplying a SHIFT_CK pulse, causing D-FF 50-1 to latch the scan input signal SCAN_IN, and causing D-FF 50-j to latch the data held previously in D-FF 50-(j-1). N pulses can be supplied to shift a new N-bit value into the generic scan register 46 from the SCAN_IN signal line, while shifting N bits of data out onto the SCAN_OUT signal line.

An update operation is carried out by supplying an UPDATE_CK pulse, causing D-FF 52-j to latch the output of D-FF 50-j in each bit stage.

The structure of the scan branch register 26, the profile register 28, the sector address register 30, the data register 32, and the function command register 34 in FIG. 3 is obtained from the generic scan register 46 by varying the bit length N. The bit lengths of the sector address register 30, the data register 32, and the word counter 36 are determined by the sector size and other parameters of the flash memory 4. The bit lengths of the scan branch register 26 and the profile register 28 are independent of the flash memory 4. Certain other modifications may be made to the basic structure of the generic scan register 46. For example, the sector address register 30 and data register 32 do not receive an update reset signal, and their second D-FFs 52-1 to 52-N have no reset (R) input terminal.

Figure 5:
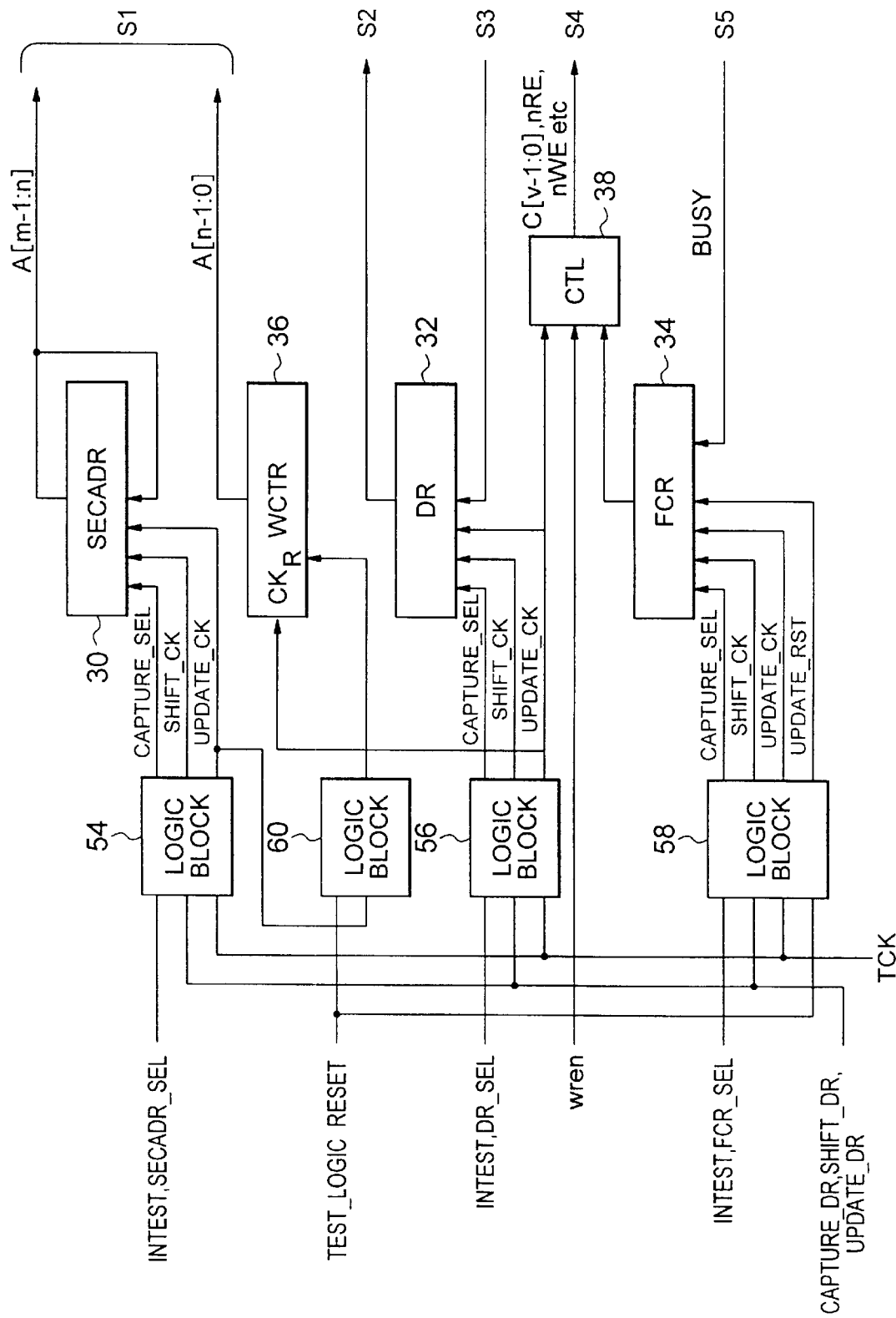
FIG. 5 is a block diagram showing part of the memory-access register block in more detail.

FIG. 5 shows further details of the memory-access register block 6, omitting the scan input and output signals, the scan branch register, the profile register, the branch decoder, and the multiplexers that were shown in FIG. 3.

The memory-access register block 6 has logic blocks 54, 56, 58, 60 that generate the necessary control signals (CAPTURE_SEL, SHIFT_CK, UPDATE_CK, UPDATE_RST) for the sector address register 30, the data register 32, and the function command register 34, and a reset signal for the word counter 36. The input signals to the logic blocks 54, 56, 58, 60 include the Test Clock signal TCK, and other signals that will be described later.

The sector address register 30 generates the sector address bits A[m−1:n] of the address signal S1 as update data, and receives these same bits A[m−1:n] as capture data.

The data register 32 receives the data output signal S2 from the flash memory 4 as capture data, and sends the data input signal S3 to the flash memory 4 as update data.

The function command register 34 captures the busy status signal S5 from the flash memory 4, and generates an instruction code as update data. The instruction code is supplied to the control circuit 38.

The word counter 36 is an n-bit counter that counts up in response to the update clock signal of the data register 32, and generates the least significant n bits A[n−1:0] of the address signal S1 as parallel count data.

The control circuit 38 receives the update clock signal of the data register 32, the update data of the function command register 34, and a write enable flag signal (wren) from the profile register 28. From these input signals, the control circuit 38 generates the control signal S4 supplied to the flash memory 4. For example, if the write enable flag (wren) is set, then whenever the data register 32 is updated, the control circuit 38 generates a write enable (nWE) pulse that writes the update data from the data register 32 into the sector buffer 18 in the flash memory 4.

Referring again to FIG. 3, the capture data supplied to the profile register 28 include coded parameter data related to the flash memory 4. The profile register 28 permits the parameter data to be captured in parallel form, then read out through the multiplexers 42, 44 and test access port in serial form. The parameter data provide information from which the bit lengths of the sector address register 30, data register 32, and word counter 36 can be determined, so that a host device connected to the test access port can establish a correct communication protocol with the interface circuit 2. The parameter data are generated within the integrated circuit and are hard-wired.

By decoding the update data of the scan branch register 26, the branch decoder 40 generates selection signals PRF_SEL, SECADR_SEL, DR_SEL, FCR_SEL that select the profile register 28, the sector address register 30, the data register 32, and the function command register 34, respectively. SECADR_SEL, DR_SEL, and FCR_SEL are supplied to the corresponding logic blocks 54, 56, 58 in FIG. 5. Arbitrary capture data may be supplied to the scan branch register 26.

Multiplexer 42 selects the serial output of the profile register 28, the sector address register 30, the data register 32, or the function command register 34. Multiplexer 44 selects the output of the multiplexer 42 or the serial output of the scan branch register 26, thereby generating the multiplexed output signal S8.

Figure 6:
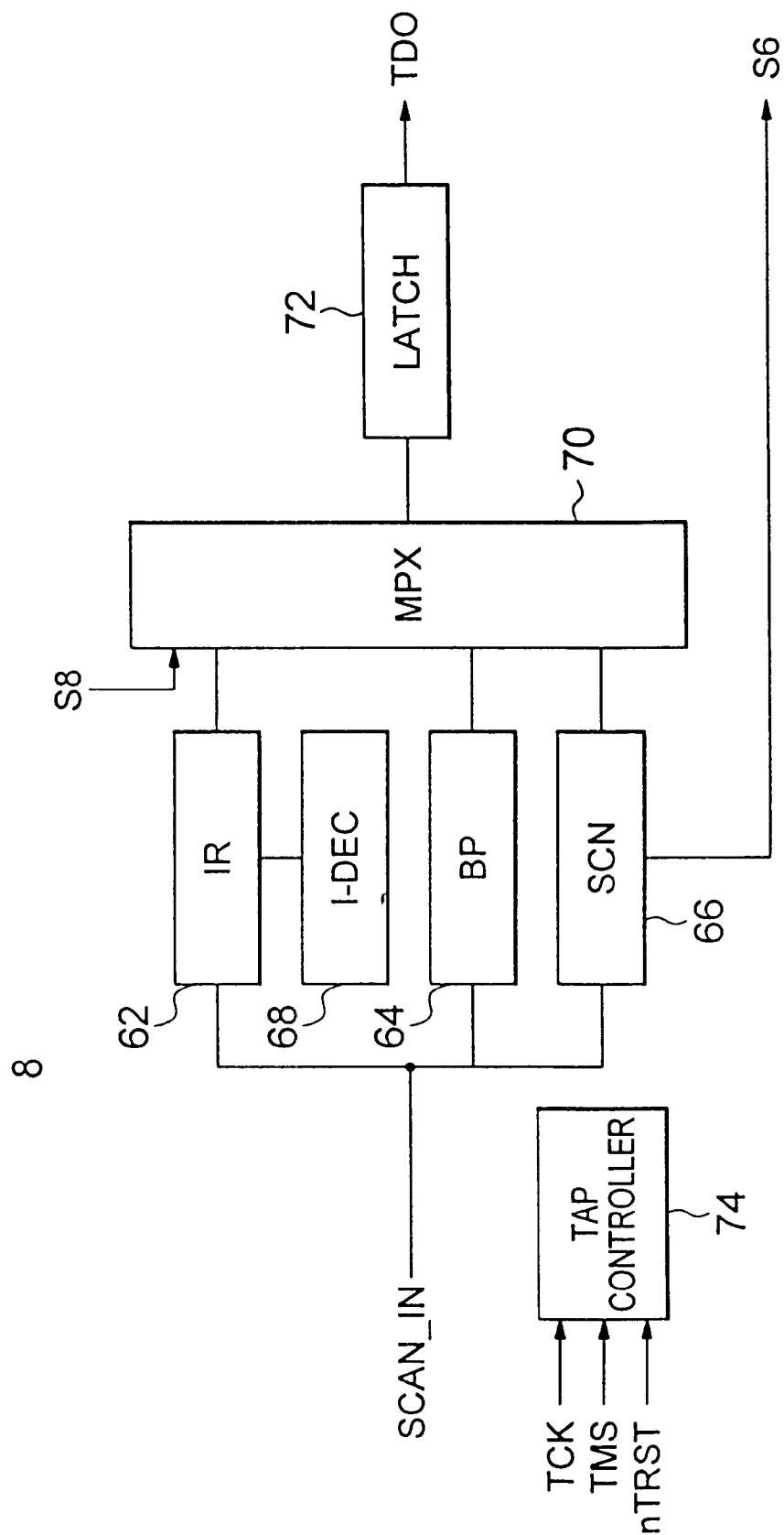
FIG. 6 is a block diagram of the TAP circuit in FIG. 1.

Referring to FIG. 6, the TAP circuit 8 basically has the structure described in the IEEE 1149.1 standard, comprising an instruction register (IR) 62, a bypass register (BP) 64, a scan number register (SCN) 66, an instruction decoder (I-DEC) 68, a multiplexer 70, a latch 72, and a TAP controller 74. The instruction register 62, the bypass register 64, and the scan number register 66 have the generic structure described in FIG. 4. The bit lengths of these registers are unrelated to the sector size and other parameters of the flash memory 4.

The serial data scanned into the instruction register 62 constitute an instruction code, which is decoded by the instruction decoder 68. As capture data, the instruction register 62 receives fixed data specified in the IEEE 1149.1 standard. By decoding the instruction code, the instruction decoder 68 generates various selection signals that will be described later.

When the bypass register 64 is selected, it passes the scan input signal to the multiplexer 70 with a one-bit delay, enabling a host device connected to the test access port to confirm electrical continuity between the test access port and TAP circuit 8. As capture data, the bypass register 64 receives fixed data specified in the IEEE 1149.1 standard.

When the scan number register 66 is selected, it receives the scan input signal from the TDI terminal. The scan output signal of the scan number register 66 is supplied to the multiplexer 70. The contents of the scan number register 66 are also output in parallel to the scan decoder 10 as the output signal code S6. Arbitrary capture data may be supplied to the scan number register 66.

The multiplexer 70 receives the scan output signals from the instruction register 62, the bypass register 64, and the scan number register 66, and the multiplexer output signal S8 from the memory-access register block 6; selects one of these signals; and stores the selected signal in the latch 72 in synchronization with the fall of the test clock signal (TCK). From the latch 72, the signal is supplied to the TDO terminal.

The TAP controller 74 is a state machine that receives the TCK, TMS, and nTRST signals, and controls the operations performed by registers 26, 28, 30, 32, 34, 62, 64, 66 in the register block 6 and TAP circuit 8. The TAP controller 74 generates three signals (CAPTURE_DR, SHIFT_DR, and UPDATE_DR) that are supplied to logic blocks 54, 56, 58 in the memory-access register block 6, and a TEST_LOGIC RESET signal that is supplied to logic block 60.

Figure 7:
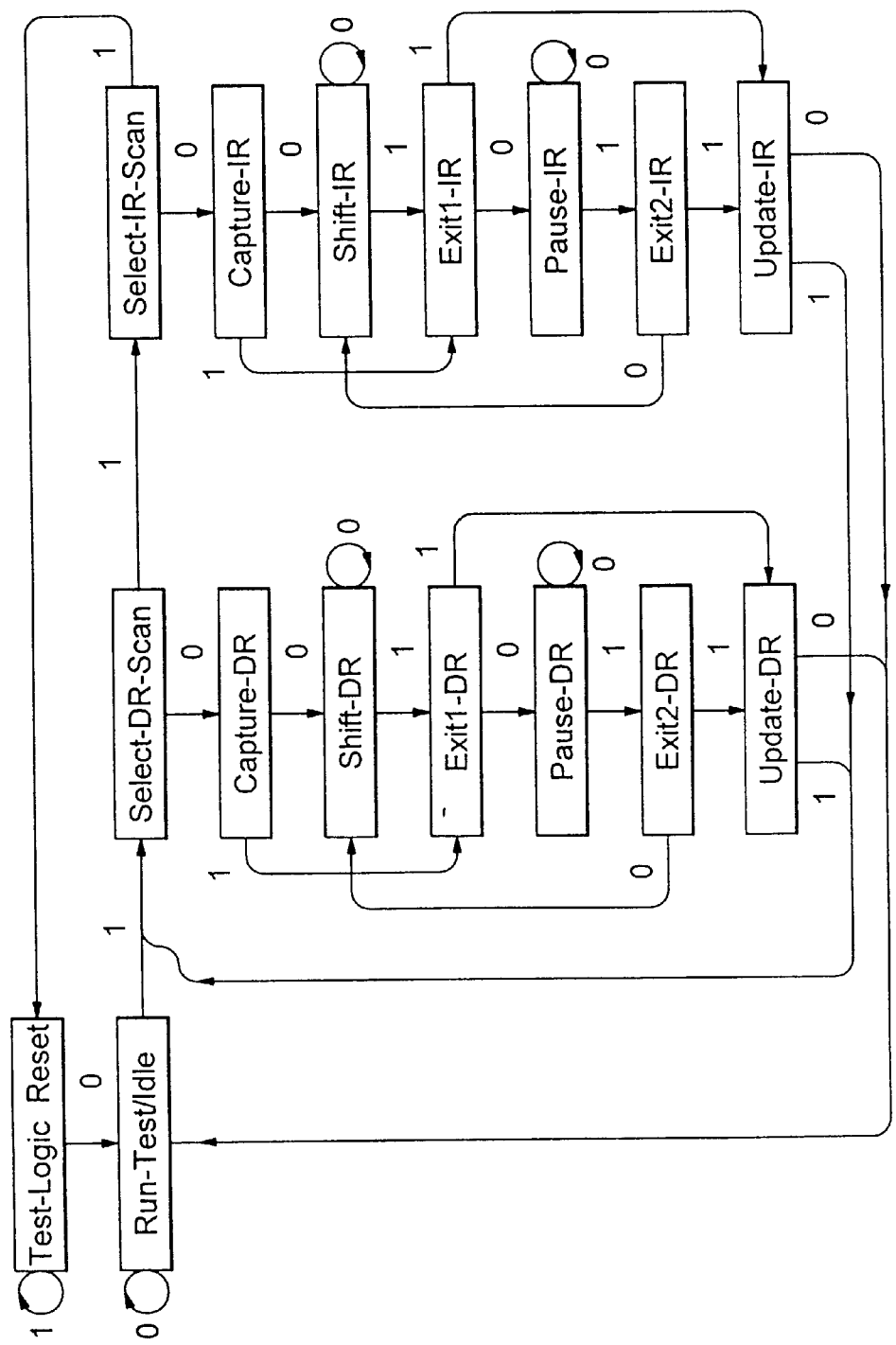
FIG. 7 is a state transition diagram for the TAP controller in FIG. 6.

The sixteen states of the TAP controller 74, and the main transitions among them, are illustrated in FIG. 7. The illustrated state transitions occur at the rise of the test clock signal (TCK), according to the logic level of the test mode select signal (TMS). Each state transition is indicated by an arrow in FIG. 7, with the corresponding TMS logic level shown next to the arrow.

When the nTRST terminal is driven to the '0' logic level, the TAP controller 74 immediately returns to the Test-Logic Reset state, regardless of its current state, and regardless of the logic levels at the TMS and TCK terminals. A transition to the Test-Logic Reset state resets the scan branch register 26, the profile register 28, the function command register 34, the word counter 36, the instruction register 62, and the scan number register 66.

The rightmost column of seven states in FIG. 7, with state names ending in -IR, perform capture, shift, and update operations on the instruction register 62. These operations will also be referred to as instruction scan operations. The adjacent column of seven states, with state names ending in -DR, perform capture, shift, and update operations on a selected one of registers 26, 28, 30, 32, 34, 64, 66. These registers will be referred to collectively as data scan registers, and the operations performed on them will be referred to as data scan operations.

When the TAP controller 74 is in the Capture-IR state, the instruction register 62 captures fixed data. When the TAP controller 74 is in the Shift-IR state, the contents of the instruction register 62 are shifted one bit, in the direction toward the TDO terminal, at each TCK cycle. This state can be held for a number of TCK cycles equal to the bit length of the instruction register 62 to load a complete new instruction code into the instruction register 62. When the TAP controller 74 is in the Update-IR state, the instruction register 62 updates its parallel output data (update data).

Similar capture, shift, and update operations are carried out on the data scan registers 26, 28, 30, 32, 34, 64, 66 when the TAP controller 74 is in the Capture-DR, Shift-DR, and Update-DR states.

The other states shown in FIG. 7 are temporary states that do not directly affect the operation of the scan registers 26, 28, 30, 32, 34, 62, 64, 66.

Instruction scan and data scan operations are carried out by logic that will be described next.

Figure 8:
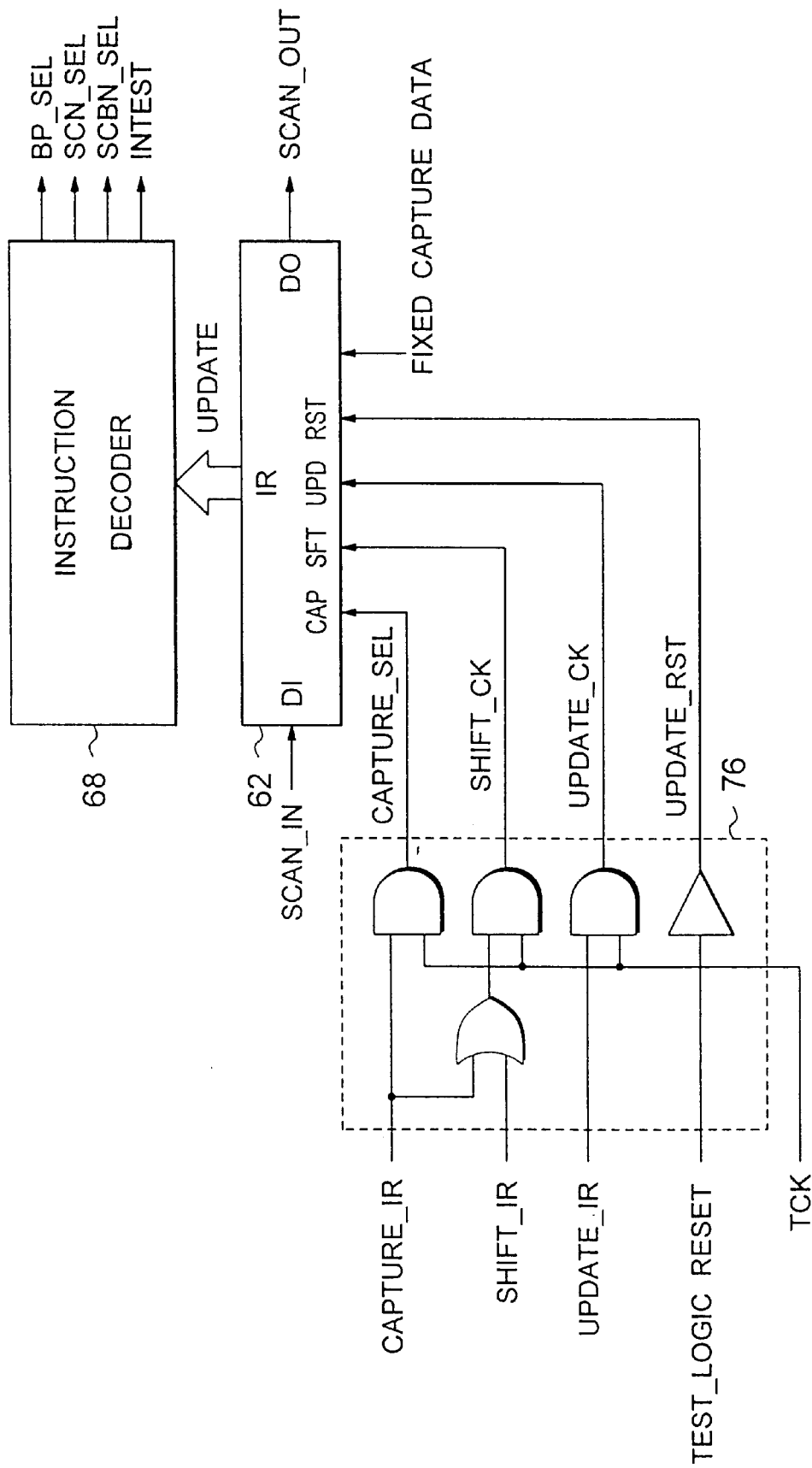
FIG. 8 is a circuit diagram of the instruction register in FIG. 6, showing the associated logic block and decoder.

Referring to FIG. 8, when the TAP controller 74 is in the Capture-IR, Shift-IR, Update-IR, and Test-Logic Reset states, it sends corresponding signals (CAPTURE_IR, SHIFT_IR, UPDATE_IR, TEST-LOGIC RESET) to a logic block 76 that generates the control signals for the instruction register 62. These control signals (CAPTURE_SEL, SHIFT_CK, UPDATE_CK, UPDATE_RST) and the scan input and output signals (SCAN_IN and SCAN_OUT) operate as in the generic scan register in FIG. 4. The fixed capture data correspond to Capture1 to CaptureN in FIG. 4. The abbreviations CAP, SFT, UPD, and RST mean capture, shift, update, and reset, respectively. The instruction register 62 performs a capture operation when CAPTURE_IR and TCK are both in the logical '1' state, a shift operation when SHIFT_IR and TCK are both in the logical '1' state, an update operation when UPDATE_IR and TCK are both in the logical '1' state, and an update reset operation whenever TEST_LOGIC RESET is in the logical '1' state. The SHIFT_CK signal is needed in both capture and shift operations, so it is generated from TCK when either CAPTURE_IR or SHIFT_IR is in the logical '1' state.

By decoding the update data output from the instruction register 62, the instruction decoder 68 generates a BP_SEL signal that selects the bypass register 64, an SCN_SEL signal that selects the scan number register 66, an SCBN_SEL signal that selects the scan branch register 26, and an INTEST signal that collectively selects the profile register 28, the sector address register 30, the data register 32, and the function command register 34. The name INTEST, incidentally, indicates that these registers 28, 30, 32, 34 are internal registers, rather than boundary scan registers.

When the TAP controller 74 is in the Capture-DR, Shift-DR, Update-DR, and Test-Logic Reset states, it sends corresponding signals (CAPTURE_DR, SHIFT_DR, UPDATE_DR, TEST_LOGIC RESET) to the logic blocks that generate control signals for the data scan registers. These logic blocks have the generic structure shown in FIG. 9, which is essentially the structure shown in FIG. 8 with input of an additional selection signal, denoted X_SEL. The signal denoted X_SEL is derived in various ways, described below, from the selection signals output by the instruction decoder 68 and the branch decoder 40, and the decoded signal S7 output by the scan decoder 10. A capture operation is performed when X_SEL and CAPTURE_DR are both in the logical '1' state. X_SEL must also be in the logical '1' state when shift and update operations take place.

Figure 9:
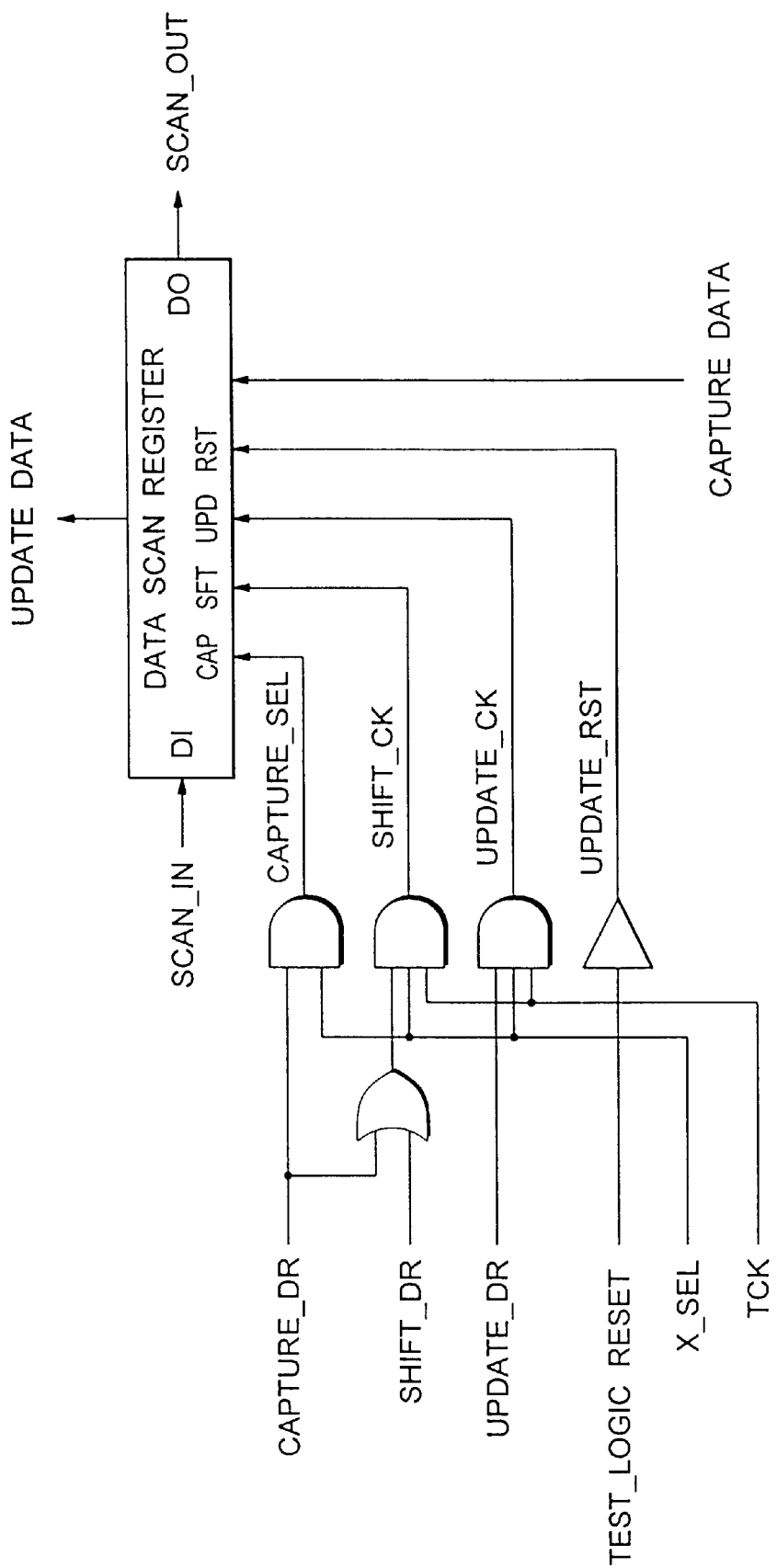
FIG. 9 is a circuit diagram showing the logic block of a typical scan data register in FIG. 3.
Figure 10:
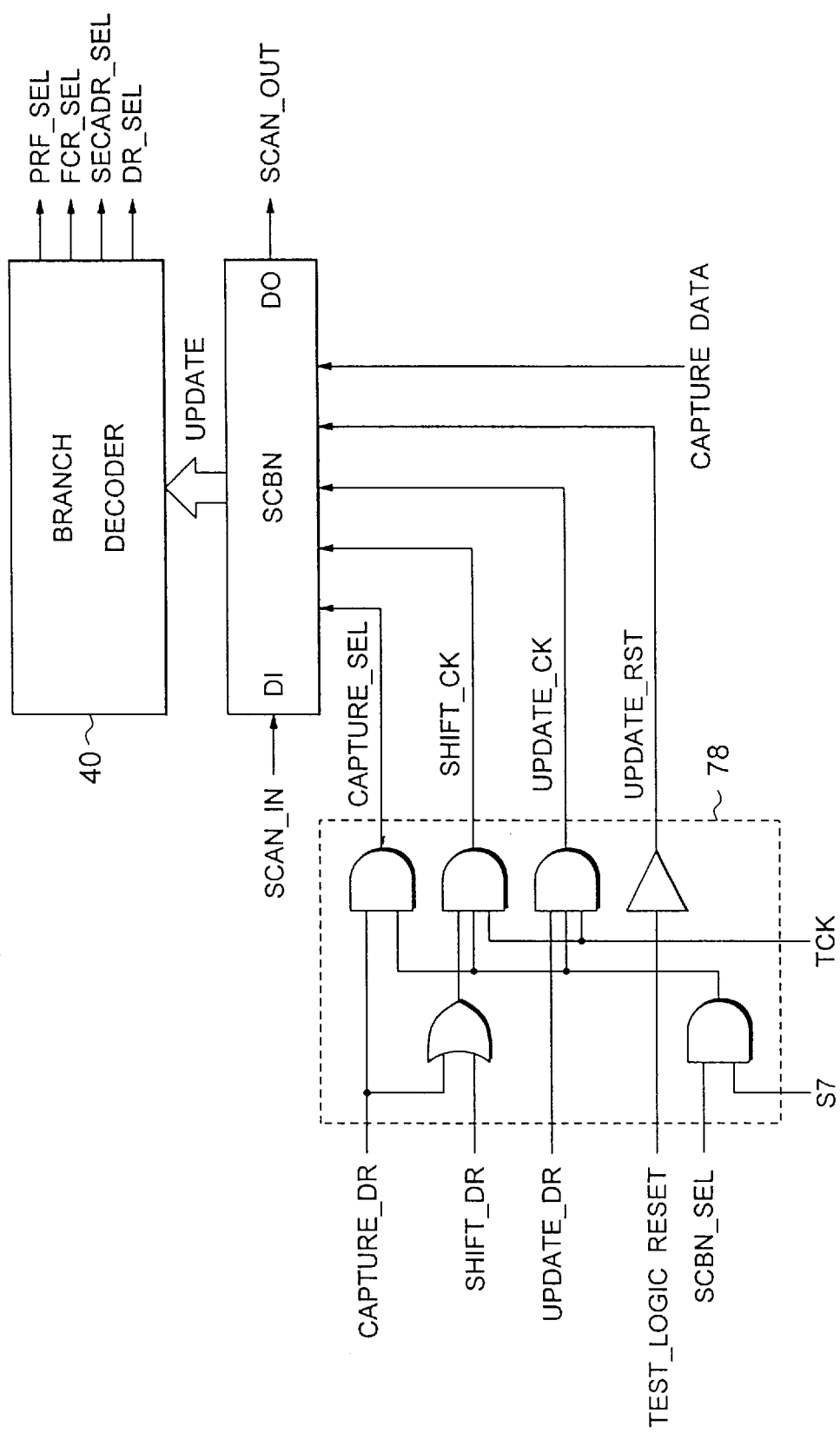
FIG. 10 is a circuit diagram showing the logic block of the scan branch register in FIG. 3.

FIG. 10 illustrates the logic block 78 that controls the scan branch register 26. The signal that was denoted X_SEL in FIG. 9 is obtained as the logical AND of the SCBN_SEL signal output from the instruction decoder 68 and the decoded signal S7 output from the scan decoder 10. By decoding the update data from the scan branch register 26, the branch decoder 40 generates the selection signals (PRF_SEL, SECADR_SEL, DR_SEL, FCR_SEL) mentioned above.

Figure 11:
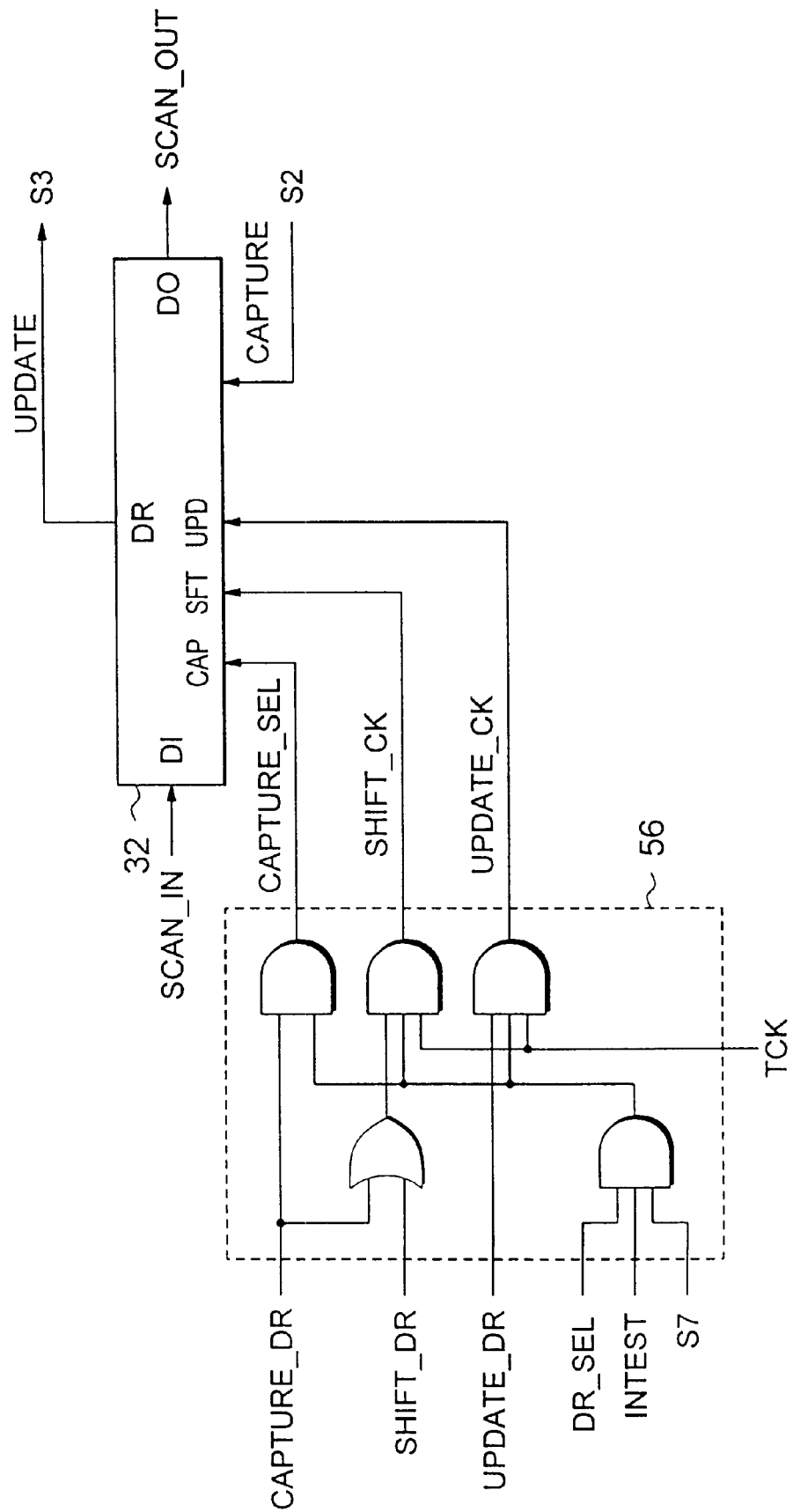
FIG. 11 is a circuit diagram showing the logic block of the data register in FIG. 3.

The logic block that controls the profile register 28 and the logic blocks 54, 56, 58 shown in FIG. 5 have the ,E: basic structure shown in FIG. 9, with minor modifications such as the removal of unnecessary reset signal inputs. As an example, FIG. 11 illustrates the logic block 56 that controls the data register 32. The signal denoted X_SEL in FIG. 9 is now obtained as the logical AND of the INTEST signal from the instruction decoder 68, the decoded signal S7 from the scan decoder 10, and the DR_SEL signal from the branch decoder 40. Similarly, the X_SEL signals for the profile register 28, the sector address register 30, and the function command register 34 are obtained as the logical AND of INTEST, S7, and the appropriate selection signal (PRF_SEL, SECADR_SEL, or FCR_SEL) from the branch decoder 40.

Drawings of the logic blocks associated with the bypass register 64 and the scan number register 66 will be omitted. For these two registers, X_SEL is obtained from the corresponding selection signal (BP_SEL or SCN_SEL) output from the instruction decoder 68.

Figure 12:
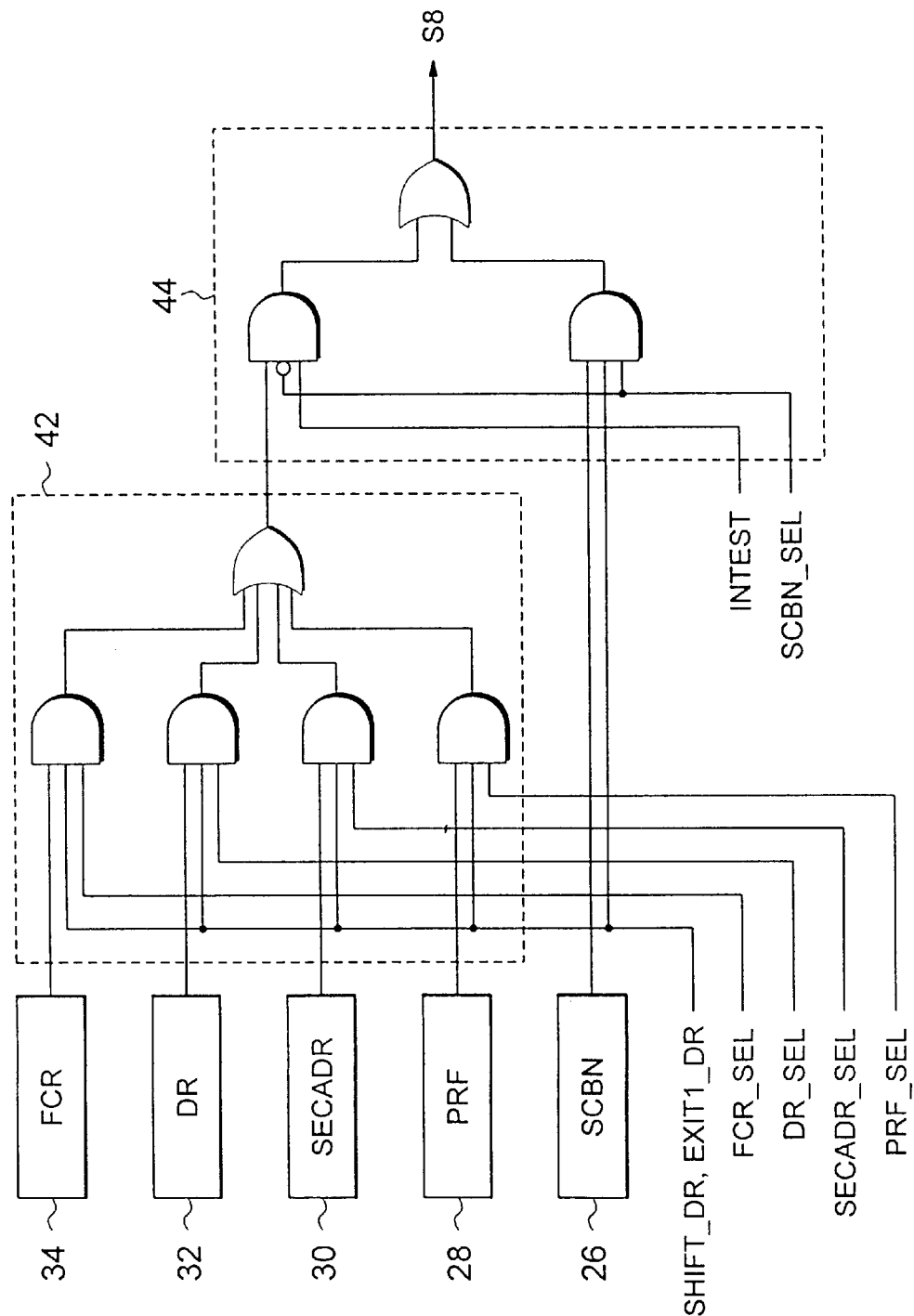
FIG. 12 is a circuit diagram of the multiplexers in FIG. 3.

FIG. 12 illustrates the structure of the multiplexers 42, 44 in the memory-access register block 6. The SHIFT_DR and EXIT1_DR signals are state signals output by the TAP controller 74 in the corresponding states, shown in FIG. 7. Thus, multiplexer 42 selects the scan outputs of the profile register 28, the sector address register 30, the data register 32, and the function command register 34 when the TAP controller 74 is in the Shift-DR or Exit1-DR state and the corresponding selection signal (PRF_SEL, SECADR_SEL, DR_SEL, or FCR_SEL) is in the logical '1' state. Multiplexer 44 selects the scan output of the scan branch register 26 when the TAP controller 74 is in the Shift-DR or Exit1-DR state and SCBN_SEL is in the logical '1' state. Multiplexer 44 selects the output of multiplexer 42 when INTEST is in the logical '1' state and SCBN_SEL is in the logical '0' state. The signal selected by multiplexer 44 becomes the multiplexed output signal S8 of the memory-access register block 6.

Figure 13:
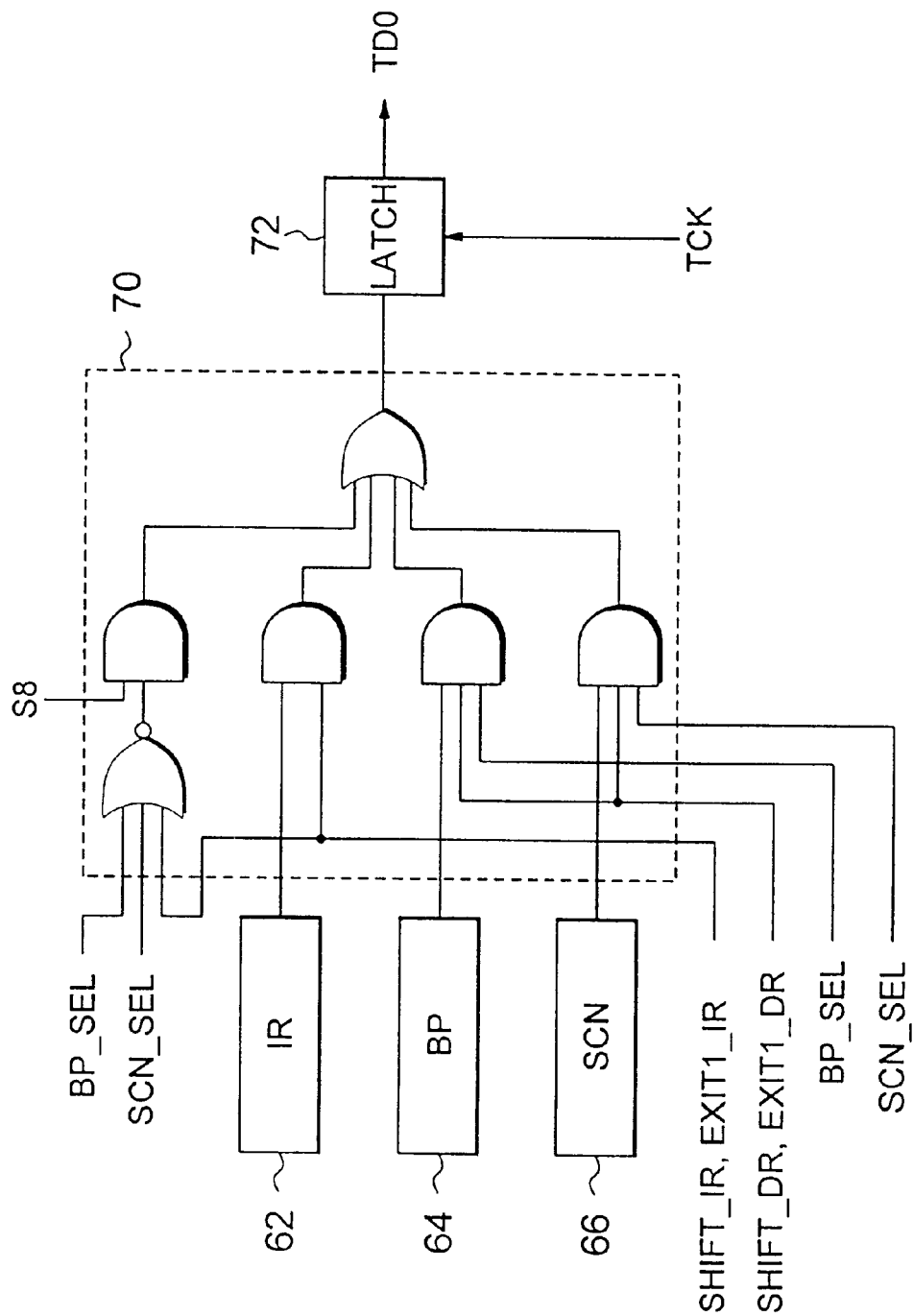
FIG. 13 is a circuit diagram of the multiplexer in FIG. 6.

FIG. 13 illustrates the structure of the multiplexer 70 in the TAP circuit 8. The SHIFT IR and EXIT_IR signals are state signals output by the TAP controller 74 in the corresponding states, shown in FIG. 7. Thus, multiplexer 70 selects the scan output of the instruction register 62 when the TAP controller 74 is in the Shift-IR or Exit1-IR state. Multiplexer 70 selects the scan output of the bypass register 64 or scan number register 66 when the TAP controller 74 is in the Shift-DR or Exit1-DR state and the corresponding selection signal (BP_SEL or SCN_SEL) is in the logical '1' state. Multiplexer 70 selects the multiplexed output signal S8 from the memory-access register block 6 when the TAP controller 74 is not in the Shift-IR or Exit1-IR state and BP_SEL and SCN_SEL are both in the logical '0' state. The signal selected by the multiplexer 70 is supplied to the latch 72.

Taken together, the three multiplexers 42, 44, 70 supply the latch 72 with the scan output signal from the instruction register 62 during instruction scan operations, and with the scan output signal from a selected data scan register 26, 28, 30, 32, 34, 64, or 66 during data scan operations. The signal supplied to the latch 72 is stored and output at the TDO terminal in synchronization with the test clock signal TCK.

A description will now be given of the operation of the interface circuit 2.

An external host device uses the TDI, TCK, TMS, and nTRST terminals of the test access port to access the scan registers 26, 28, 30, 32, 34, 62, 64, 66 and control the operation of the interface circuit 2. The host device can also obtain parameter values of the flash memory 4 and determine the internal state of the interface circuit 2 from the information scanned out at the TDO terminal.

When accessing a data scan register, the host device uses the instruction codes listed in FIG. 14 to select the register. The bypass register 64, the scan number register 66, and the scan branch register 26 are selected by individual instruction codes respectively denoted BYPASS, SCAN_N, and SCAN_BN. A further instruction code denoted INTEST selects the profile register 28, the sector address register 30, the data register 32, and the function command register 34 as a group. These four registers are then selected individually by a code set in the scan branch register 26, referred to below as the SCBN code. The above instruction codes and SCBN code are scanned into the interface circuit 2 through the TDI terminal.

An instruction code is shifted into the instruction register 62 by manipulating the logic level at the TMS terminal to bring the TAP controller 74 into the Shift-IR state, as indicated in FIG. 7, and remaining in that state for the necessary number of TCK cycles while the instruction code is supplied bit by bit to the TDI terminal. The TMS input is then changed to move the TAP controller 74 into the Update-IR state, thereby performing an update operation on the instruction register 62 and making the instruction code available to the instruction decoder 68. The instruction decoder 68 decodes the instruction code and generates a scan data register selection signal. This entire operation will be described below by saying that the instruction code is scanned into the instruction register 62 and decoded.

If the instruction code is the SCAN_BN code, the scan branch register 26 is selected. The TMS logic level can now be manipulated as indicated in FIG. 7 to bring the TAP controller 74 into the Shift-DR state and shift an SCBN code into the scan branch register 26. Next, the TMS logic level is changed to bring the TAP controller 74 into the Update-DR state, thereby supplying the SCBN code to the branch decoder 40. The branch decoder 40 decodes the SCBN code and generates a further scan data register selection signal. This entire operation will be described below by saying that the SCBN code is scanned into the scan branch register 26 and decoded.

After the SCBN code has been scanned into the scan branch register 26 and decoded, the INTEST instruction code can be scanned into the instruction register 62 and decoded to have the instruction decoder 68 generate the INTEST signal needed for access to the data scan register selected by the branch decoder 40.

The above operations, involving the BYPASS, the SCAN_N, the SCAN_BN, and the INTEST instruction codes and the SCBN code, enable any one of the data scan registers 26, 28, 30, 32, 34, 64, 66 to be selected. Arbitrary information can then be scanned into the selected data scan register from the host device through the TDI terminal, or scanned out from the selected data scan register to the host device through the TDO terminal. Information scanned into the scan number register 66 can be output to the scan decoder 10, by updating the scan number register 66, whereupon the information is decoded by the scan decoder 10 to generate the decoded signal S7.

To program the flash memory 4, a flash programmer is connected as the host device to the test access port. To begin programming, the flash programmer drives the nTRST terminal to the '0' logic level, placing the TAP controller 74 in the Test-Logic Reset state, and initializing the word counter 36 and the scan number register 66.

Next, after the nTRS-T terminal has been returned to the '1' logic level, the SCAN_N instruction code is scanned into the instruction register 62 and decoded, selecting the scan number register 66. A predetermined code is then scanned into the scan number register 66 and decoded by the scan decoder 10. This predetermined code causes the scan decoder 10 to set signal S7 to the '1' logic level, selecting the memory-access register block 6, thereby enabling the scan registers in the memory-access register block 6 to be selected.

The profile register 28 is now selected as described above: the SCAN_BN instruction code is scanned into the instruction register 62 and decoded; the '0000' SCBN code is scanned into the scan branch register 26 and decoded; and the INTEST instruction code is scanned into the instruction register 62 and decoded.

When the profile register 28 has been selected in this way, data scan operations are carried out to load capture data into the profile register 28, scan this capture data out at the TDO terminal, and update the profile register 28. The update operation sets the write enable flag (wren), which is necessary in order for the control circuit 38 to transfer data from the data register 32 to the sector buffer 18.

By decoding the capture data scanned out from the profile register 28, the flash programmer obtains parameters describing the memory capacity, word width, and sector size of the flash memory 4. From these parameters, the flash programmer determines the bit length of the sector address register 30, the data register 32, and the word counter 36. In subsequent access to the interface circuit 2, the flash programmer uses a communication protocol adjusted to these parameters and bit lengths.

Next, the sector address register 30 is selected by the procedure described above: the SCAN_BN instruction code is scanned into the instruction register 62 and decoded; the '0010' SCBN code is scanned into the scan branch register 26 and decoded; and the INTEST instruction code is scanned into the instruction register 62 and decoded. The sector address code A[m−1:n] of the sector 24 to be programmed is now scanned into the sector address register 30 and the sector address register 30 is updated, setting the sector address code A[m−1:n] in the upper bits of the address signal S1. Since the word counter 36 was reset by the initial nTRST signal, the word address code A[n−1:0] in the address signal S1 also has a known value at this point.

To transfer the data to be programmed to the sector buffer 18, the data register 32 is selected by the procedure described above: the SCAN_BN instruction code is scanned into the instruction register 62 and decoded; the '0100' SCBN code is scanned into the scan branch register 26 and decoded; and the INTEST instruction code is scanned into the instruction register 62 and decoded. Data words are then scanned into the data register 32 one by one, each word having the bit length of the data register 32. After each word is scanned in, the data register 32 is updated, thereby sending the word to the sector buffer 18, which stores the word at the address indicated by the address signal S1. Since the update operation increases the word count in the word counter 36, thereby increasing the word address code A[n−1:0] in the address signal S1, each word is stored at a different address in the sector buffer 18. The update operation on the data register 32 also triggers the output of a write pulse by the control circuits 20, 38 in the flash memory 4 and memory-access register block 6. Specifically, the control circuit 38 sets the nWE bit in the control signal S4 for a certain interval, and the control circuit 20 sends corresponding write data to the sector buffer 18.

When a number of words equivalent to the sector size has been transferred into the sector buffer 18, the function command register 34 is selected by the procedure described above: the SCAN_BN instruction code is scanned into the instruction register 62 and decoded; the '0001' SCBN code is scanned into the scan branch register 26 and decoded; and the INTEST instruction code is scanned into the instruction register 62 and decoded. A programming command code is scanned into the function command register 34, and the function command register 34 is updated. The control circuit 38 in the memory-access register block 6 passes the programming command code to the control circuit 20 in the flash memory 4, using the C[v−1:0] bits in control signal S4. Control circuit 20 then initiates operations that automatically erase the selected sector 24 in the memory cell array 12, and write all of the data stored in the sector buffer 18 simultaneously into the erased sector 24. The busy status signal S5 is set to the '1' logic level while these operations are in progress, and reset to the '0' logic level when programming is completed.

After giving the programming command, the flash programmer repeatedly scans a No Operation command code into the function command register 34, also carrying out capture and update operations on the function command register 34. The function command register 34 repeatedly captures the busy status signal S5 from the flash memory 4, scans this signal out at the TDO terminal, and sends No Operation commands to control circuit 38. The control circuit 20 in the flash memory 4 continues erasing and programming the selected sector of memory cells. By checking the busy status signal, the flash programmer recognizes the completion of programming of the selected sector 24, and can then proceed with operations for programming the next sector.

Next, the procedure for reading the contents of the flash memory 4 through the test access port will be described. This procedure can be used by the flash programmer or another host device to confirm that correct * data are stored in the flash memory 4.

To begin this procedure, the host device drives the nTRST terminal to the '0' logic level, resetting the word counter 36, the profile register 28, and the scan number register 66. The write enable flag (wren) output from the profile register 28 is thereby reset, disabling the write enable bit nWE in the control signal S4 sent to the flash memory 4.

Next, after the nTRST terminal has been returned to the '1' logic level, the SCAN_N code is scanned into the instruction register 62 and decoded to select the scan number register 66. The predetermined code mentioned above is scanned into the scan number register 66 and decoded by the scan decoder 10, setting the decoded signal S7 to the '1' logic level and selecting the memory-access register block 6.

Next, the SCAN_BN instruction code is scanned into the instruction register 62 and decoded, the '0010' SCBN code is scanned into the scan branch register 26 and decoded, and the INTEST instruction code is scanned into the instruction register 62 and decoded, selecting the sector address register 30. The sector address code A[m−1:n] of the sector 24 to be read is scanned into the sector address register 30 and set in the upper bits of the address signal S1. The word address code A[n−1:0] in the address signal S1 has the known value set when the word counter 36 was reset by the nTRST signal.

Next, the SCAN_BN instruction code is scanned into the instruction register 62 and decoded, the '0100' SCBN code is scanned into the scan branch register 26 and decoded, and the INTEST instruction code is scanned into the instruction register 62 and decoded, selecting the data register 32. Capture, shift, and update operations are performed on the data register 32, whereby the data register 32 captures the word of data output by the flash memory 4 from the address designated by the address signal S1, and scans this word out at the TDO terminal. Each update of the data register 32 increases the word count in the word counter 36, thereby increasing the word address code A[n−1:0] in the address signal S1. The capture, shift, and update operations can be repeated to read a desired number of words from consecutive addresses in the selected sector 24 in the memory cell array 12.

As long as the write enable flag (wren) remains in its reset state, the control signal S4 output from control circuit 38 holds the flash memory 4 in the read state. The actual reading of the output data signal S2 from the sense amplifiers 22 takes place during the TCK pulse that occurs when the TAP controller 74 is in the Capture-DR state. As can be seen from FIG. 7, there is an interval of at least two TCK pulses from the update operation to the next capture operation. If this interval is equal to or greater than the read access time of the flash memory 4, correctly read data will be captured and scanned out at the TDO terminal. As the TCK frequency is normally one megahertz or less, and the read access time of the flash memory 4 is much less than one microsecond, an ample timing margin is left.

A basic advantage of the first embodiment is that scan data registers 28, 30, 32, 34 in the memory-access register block 6 are not connected in a single chain, but are disposed on parallel paths between the TDI and TDO terminals. Once selected, each of these scan data registers can accordingly be accessed directly, without the need to shift data in or out through other registers in the memory-access register block 6.

Another advantage is that once a sector address has been set in the sector address register 30, addresses within the sector are generated automatically by the word counter 36, so it is not necessary to scan in a separate address for every word of data written or read.

Yet another advantage is that the necessary control signals for reading or writing each word of data are generated automatically by the control circuit 38 in the memory-access register block 6, so it is not necessary to scan in a new control code for access to each word.

As a result, once a sector address has been scanned into the sector address register 30 and the data register 32 has been selected, data can be read from the flash memory 4, or transferred into the sector buffer 18, at a comparatively high speed. The number of shift operations needed to transfer each word of data is only equal to the bit length of the data register 32, instead of being equal to the combined bit length of the data register and other registers.

A further advantage of the first embodiment is that information describing the memory capacity, sector size, and word width of the flash memory 4 is hard-wired into the interface circuit 2 as capture data for the profile register 28, and can be scanned out and read by the flash programmer. The flash programmer can thereby determine the bit lengths of the sector address register 30 and the data register 32, and set itself up automatically for the correct communication protocol. Besides preventing programming mistakes, this enables the flash memory to be designed without the worry that a particular design might not be compatible with the flash programmer's capabilities.

It is even possible to design a chip with two or more flash memory modules, each having its own memory-access register block 6. The scan decoder 10 can be adapted to generate a separate selection signal for each memory-access register block by decoding a corresponding code placed in the scan number register 66.

It is also an advantage that all of the scan data registers in the memory-access register block 6 can be selected by the use of just two instruction codes (SCAN_BN and INTEST in FIG. 14). Although the bit length of the instruction register 62 is not specified in the IEEE 1149.1 standard, whatever length the instruction register 62 has limits the number of available instruction codes. If only two of these instruction codes are used for flash-memory programming, the number of instruction codes available for other purposes, such as debugging functions, is increased accordingly.

The capability to program the flash memory through the standard IEEE 1149.1 test access port and then test or debug the programmed device through the same IEEE 1149.1 test access port is also advantageous.

A final advantage is that MCU resources do not have to be used for flash-memory programming.

Next, a second embodiment will be described. The second embodiment differs from the first embodiment in that the memory-access register block 6 is always selected.

Figure 15:
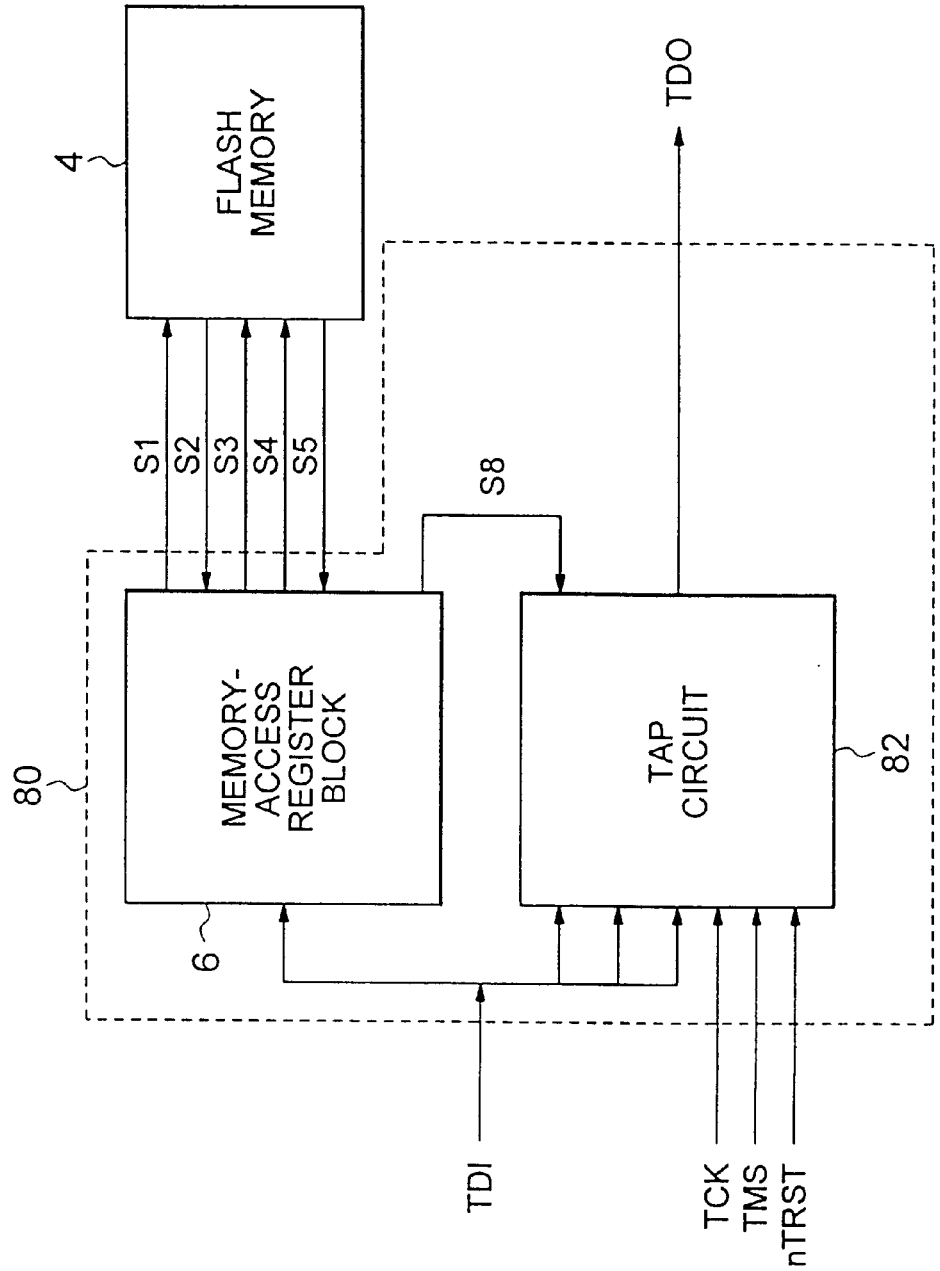
FIG. 15 is a block diagram showing an interface circuit illustrating a second embodiment of the invention.

Referring to FIG. 15, the interface circuit 80 in the second embodiment includes a memory-access register block 6 and a TAP circuit 82, but no scan decoder. The memory-access register block 6 has the structure described in the first embodiment, except that no decoded signal S7 is required to select its scan data registers. The signals S1, S2, S3, S4, S5 exchanged between the memory-access register block 6 and the flash memory 4 are the same as in the first embodiment, as is the multiplexed signal S8 output from the memory-access register block 6 to the TAP circuit 82.

Figure 16:
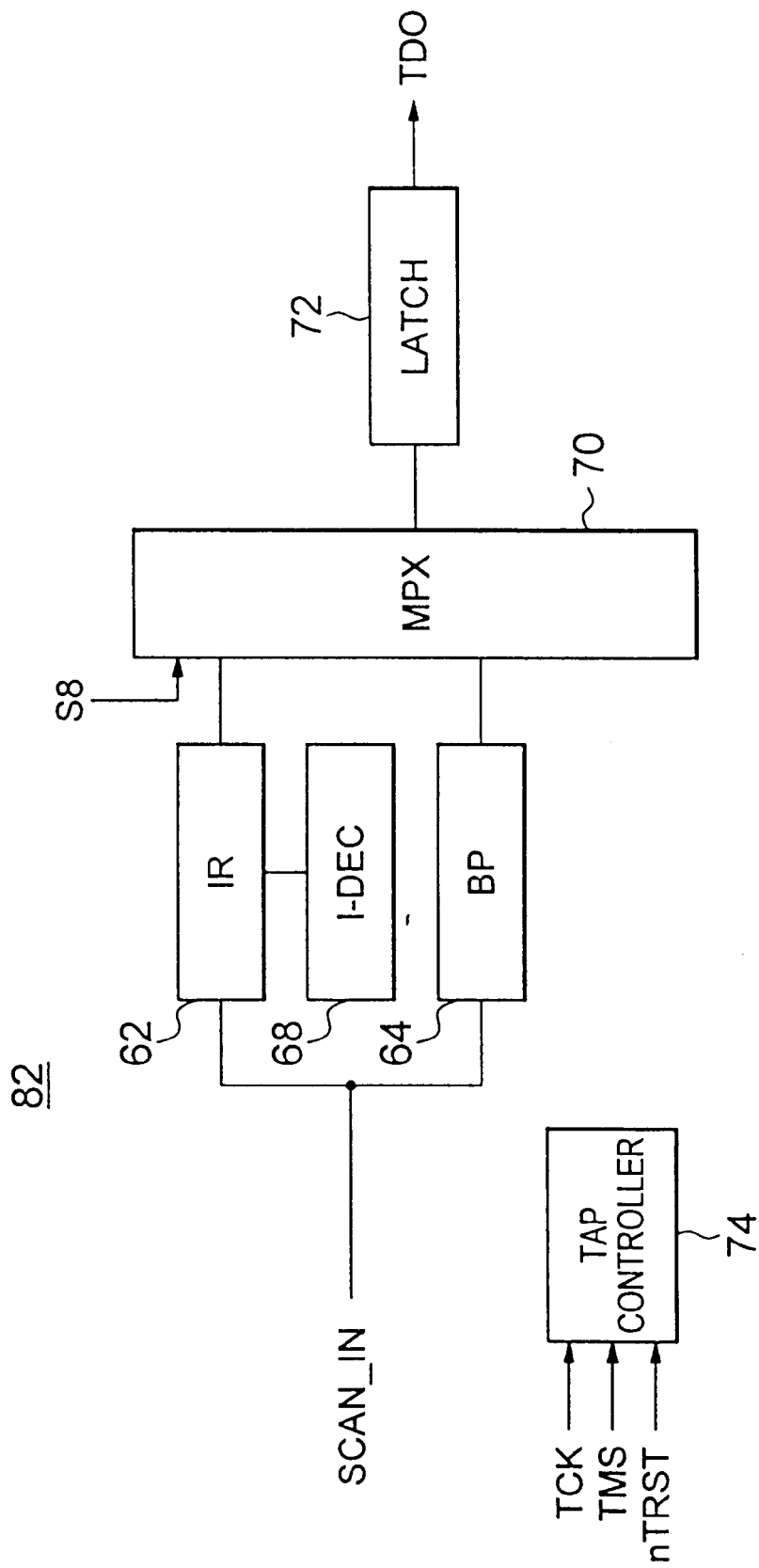
FIG. 16 is a block diagram of the TAP circuit in the second embodiment.

Referring to FIG. 16, the TAP circuit 82 comprises an instruction register 62, a bypass register 64, an instruction decoder 68, a multiplexer 70, a latch 72, and a TAP controller 74, substantially as described in the first embodiment. The instruction decoder 68 does not generate an SCN_SEL signal, there being no scan number register for this signal to select. The multiplexer 70 selects the signal S8 output from the memory-access register block 6 when the instruction register 62 and the bypass register 64 are not selected, and the TAP controller 74 is not in the Shift-IR or Exit1-IR state.

Referring to FIG. 17, the instruction codes used in the second embodiment include the BYPASS, SCAN_BN, and INTEST instruction codes described in the first embodiment, and the SCAN_BN instruction code selecting the scan branch register 26. When the INTEST instruction code is scanned in and decoded, one scan data register among the profile register 28, sector address register 30, data register 32, and function command register 34 is selected according to the contents of the scan branch register 26, as explained in the first embodiment. There is no SCAN_N instruction code.

Flash-memory access operations are performed by the procedures described in the first embodiment, except that the scan data registers 26, 28, 30, 32, 34 in the memory-access register block 6 can be accessed immediately after the TAP controller 74 and the word counter 36 have been reset by the nTRST signal. It is not necessary to scan in and decode a SCAN_N instruction code and then scan in and decode another code that selects the memory-access register block 6.

The second embodiment accordingly provides even faster access to the flash memory 4 than the first embodiment. The second embodiment also enables a flash programmer to scan out flash-memory parameters and automatically select the correct communication protocol, as in the first embodiment.

The TAP circuit 82 in the second embodiment is used only for controlling the memory-access register block 6, and not for other functions such as debugging. The interface circuit 80 operates as an independent functional block, completely independent of the MCU core and other functional bocks that may be integrated onto the same chip. The second embodiment can be usefully employed in chips having an MCU core that does not support JTAG functions, for example.

Next, a third embodiment will be described. The third embodiment uses a separate instruction code to select each scan data register.

Figure 18:
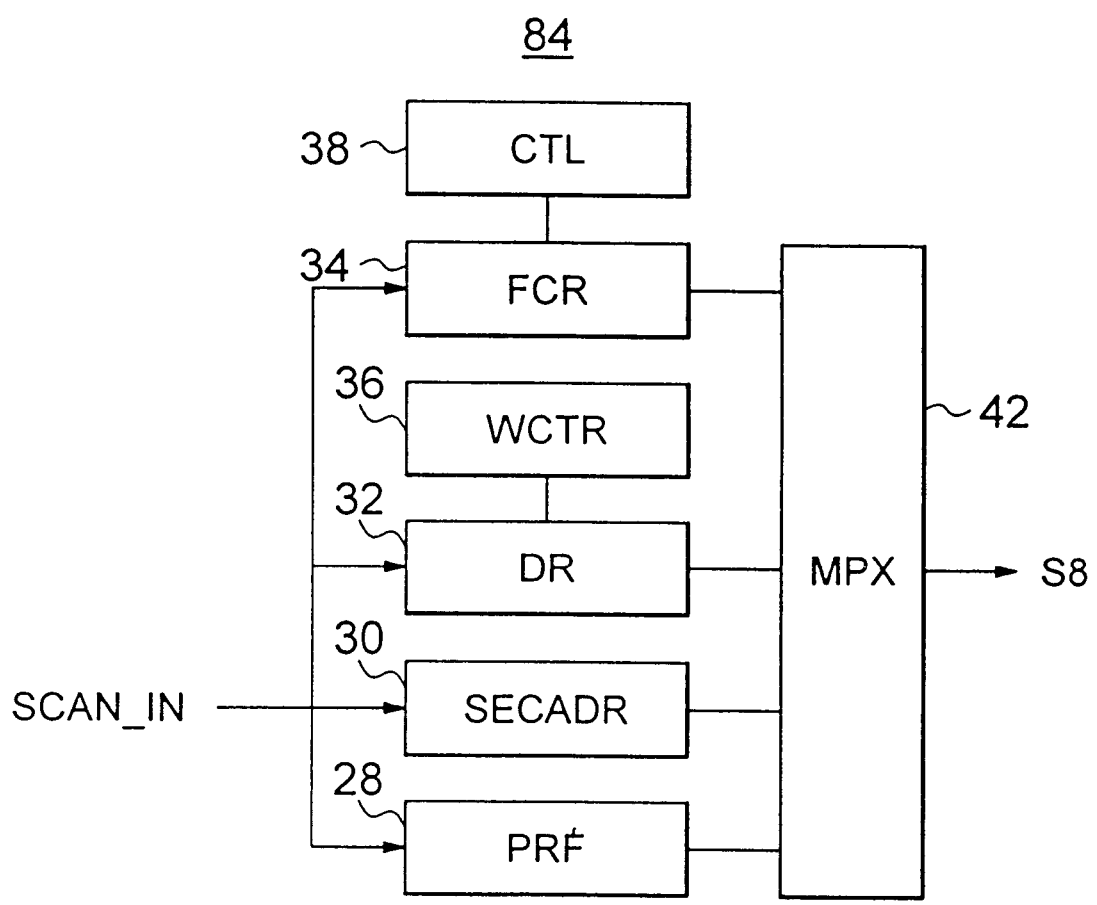
FIG. 18 is a block diagram of a memory-access register block illustrating a third embodiment of the invention.

Referring to FIG. 18, the memory-access register block 84 in the third embodiment comprises a profile register 28, a sector address register 30, a data register 32, a function command register 34, a word counter 36, a control circuit 38, and a multiplexer 42, substantially as described in the first embodiment. There is no scan branch register or branch decoder, and there is only one multiplexer 42. The multiplexed signal S8 is output directly from the multiplexer 42.

The third embodiment uses substantially the same TAP circuit as in the first embodiment, except that the instruction decoder generates a separate selection signal for each scan data register, by decoding a separate instruction code. Referring to FIG. 19, the instruction codes used in the third embodiment include the BYPASS instruction code that selects the bypass register 64, the SCAN_N instruction code that selects the scan number register 66, a PROFILE instruction code that selects the profile register 28, an SECADR instruction code that selects the sector address register 30, a DRRDWR (data register read-write) instruction code that selects the data register 32, and a FCMD instruction code that selects the function command register 34. There is no SCAN_BN instruction code or INTEST instruction code.

To program the flash memory 4, a flash programmer connected to the test access port first drives the nTRST terminal to the '0' logic level, placing the TAP controller 74 in the Test-Logic Reset state and initializing the word counter 36 and the scan number register 66. Next, after the nTRST terminal has been returned to the '1' logic level, the SCAN_N instruction code is scanned into the instruction register 62 and decoded, selecting the scan number register 66, and a predetermined code is scanned into the scan number register 66 and decoded, selecting the memory-access register block 84.

The PROFILE instruction code is now scanned into the instruction register 62 and decoded, selecting the profile register 28. Capture, shift, and update operations are performed, setting the write enable flag (wren), and providing flash-memory parameter information to the flash programmer. The flash programmer thereby determines the bit lengths of the sector address register 30, data register 32, and word counter 36.

Next, the SECADR instruction code is scanned into the instruction register 62 and decoded, selecting the sector address register 30. The desired sector address code A[m−1:n] is scanned into the sector address register 30 and the sector address register 30 is updated, setting the sector address code in the upper bits of the address signal S1.

Next, the DRRDWR instruction code is scanned into the instruction register 62 and decoded, selecting the data register 32. Data words are then scanned into the data register 32 and transferred to the sector buffer 18 as explained in the first embodiment.

After all necessary data words have been transferred, the FCMD instruction code is scanned into the instruction register 62 and decoded, selecting the function command register 34. The remaining operations are performed as described in the first embodiment. The flash programmer scans a programming instruction code into the function command register 34 to initiate the erasing and programming of the selected sector in the memory cell array 12, then repeatedly scans in No Operation instruction codes and checks the value of the busy status signal, which is scanned out at the TDO terminal, to determine when programming has been completed.

To read data from the flash memory 4, the flash programmer first drives the nTRST terminal to the '0' logic level, resetting the word counter 36, the profile register 28, the scan number register 66, and the write enable flag (wren). Next, after the nTRST terminal has been returned to the '1' logic level, the SCAN_N instruction code is scanned into the instruction register 62 and decoded, selecting the scan number register 66, and the above-mentioned predetermined code is scanned into the scan number register 66 and decoded, selecting the memory-access register block 84.

Next, the SECADR instruction code is scanned into the instruction register 62 and decoded, selecting the sector address register 30. The sector address code A[m−1:n] of the sector to be read is scanned into the sector address register 30 and set in the upper bits of the address signal S1.

The DRRDWR instruction code is now scanned into the instruction register 62 and decoded, selecting the data register 32. Data words are then captured in the data register 32 and scanned out as described in the first embodiment.

Compared with the first embodiment, the third embodiment speeds up access to the flash memory 4 by simplifying the procedure for selecting the scan data registers in the memory-access register block 84. The internal structure of the memory-access register block 84 is also simplified, as there is no scan branch register and only one-multiplexer. Other effects are the same as in the first embodiment. The third embodiment is advantageous when the instruction register 62 has enough bits to permit a separate instruction code to be used for selecting each data scan register.

In a variation of the third embodiment, the scan decoder 10 is eliminated from the interface circuit, the scan number register 66 is eliminated from the TAP circuit 8, and the memory-access register block 84 is always selected, as described in the second embodiment.

As a fourth embodiment, a type of scan register with an increased number of capture bits will now be described. This register can be employed as the profile register in any of the preceding embodiments.

Figure 20:
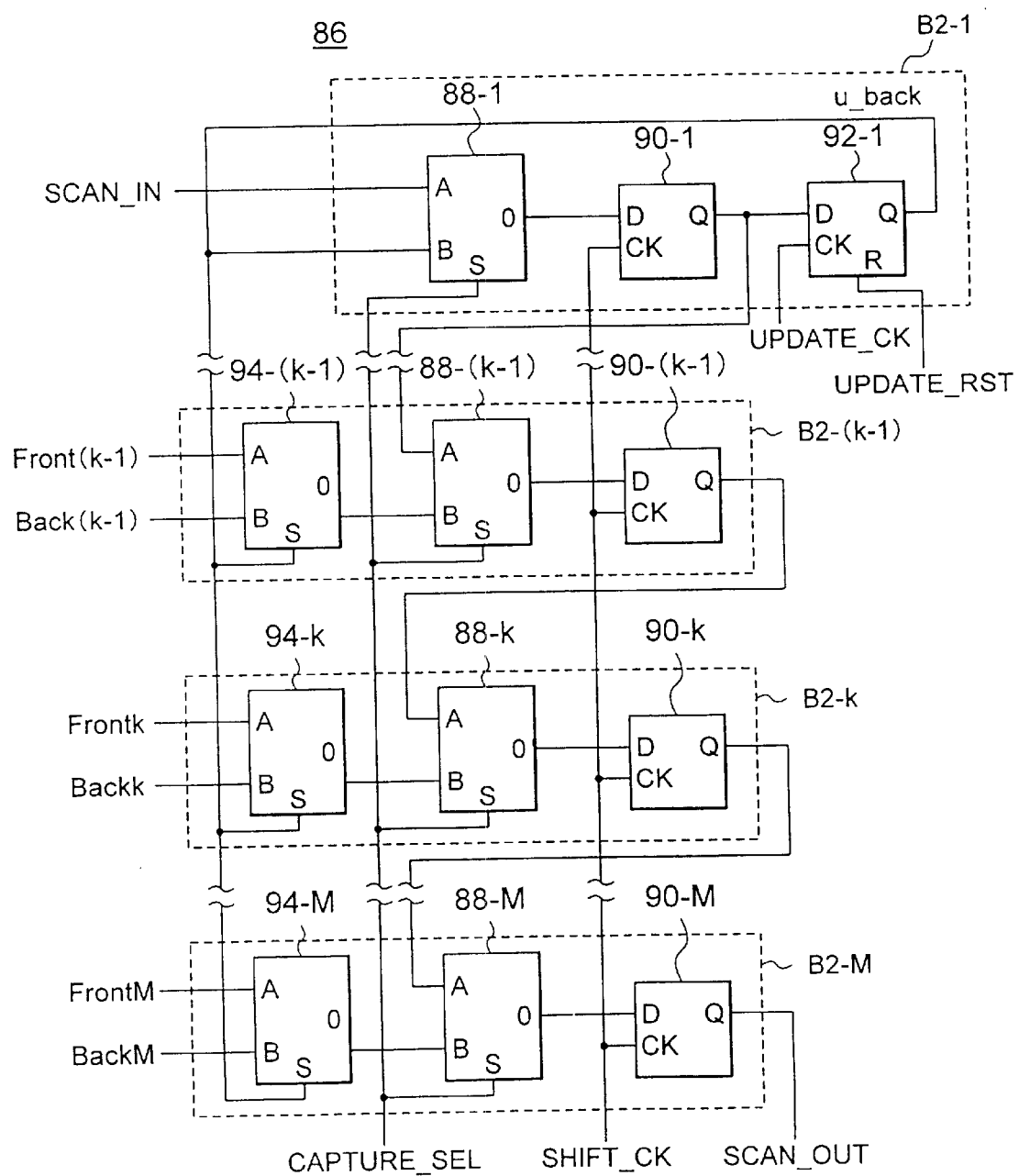
FIG. 20 is a circuit diagram of a scan register illustrating a fourth embodiment of the invention.

Referring to FIG. 20, the fourth embodiment is an M-bit scan register 86, where M is an integer equal to or greater than two ($2 \leq M$).

The first bit stage B2-1 comprises a selector 88-1 and a pair of D-FFs 90-1, 92-1 that are controlled by the CAPTURE_SEL, SHIFT_CK, UPDATE_CK, and UPDATE_RST signals described in the first embodiment.

Selector 88-1 has three input terminals (A, B, S) and an output terminal (O). Input terminal A receives a scan input signal (SCAN_IN) from the TDI terminal. Input terminal B receives the Q output signal, denoted u-back, of D-FF 92-1. Input terminal S receives the CAPTURE_SEL signal. The scan input signal (SCAN_IN) is selected when CAPTURE_SEL is at the '0' logic level; the u_back input signal is selected when CAPTURE_SEL is at the '1' logic level. The selected input signal is supplied from the output terminal (O) to the data input terminal (D) of D-FF 90-1.

D-FF 90-1 latches the output signal from selector 88-1 in synchronization with the SHIFT_CK signal, which is received at a CK input terminal. The latched signal is supplied from the Q output terminal of D-FF 90-1 to the D input terminal of D-FF 92-1, and to the A input terminal of a selector 88-2 in the second bit stage B2-2 (not visible).

D-FF 92-1 latches the output signal from D-FF 90-1 in synchronization with the UPDATE_CK signal, which is received at a CK input terminal. The latched, signal is supplied as the u_back signal to the B input terminal of selector 90-1, and to the S input terminals of selectors 94-k in other bit stages B2-k ($2 \leq k \leq M$). If necessary, the u_back signal can also be supplied as an update data signal to another circuit (not visible). The u_back output signal is reset by input of the UPDATE_RST signal at the R input terminal of D-FF 92-1.

Each of the other bit stages B2-k ($2 \leq k \leq M$) comprises a pair of selectors 94-k, 88-k and a D-FF 90-k. These stages are controlled by the CAPTURE_SEL, SHIFT_CK, and u_back signals.

Selector 94-k has three input terminals (A, B, S) and an output terminal (O). The A and B input terminals receive two different capture signals, denoted Frontk and Backk. The S input terminal receives the u-back signal, as noted above. The A input signal (Frontk) is selected when u_back is at the '0' logic level; the B input signal (Backk) is selected when u_back is at the '1' logic level. The selected input signal (Frontk or Backk) is supplied from the output terminal (O) to the B input terminal of selector 88-k.

Selector 88-k likewise has three input terminals (A, B, S) and an output terminal (O). The A input terminal receives the Q output signal from D-FF 90-(k-1) in the preceding bit stage B2-(k-1). The S input terminal receives the CAPTURE_SEL signal. The A input signal is selected when CAPTURE_SEL is at the '0' logic level; the B input signal is selected when CAPTURE_SEL is at the '1' logic level.

The selected input signal is supplied from the output terminal (O) to the D input terminal of D-FF 90-k.

D-FF 90-k latches the output signal from selector 88-k in synchronization with the SHIFT_CK signal, which is received at a CK input terminal. The latched signal is supplied from the Q output terminal of D-FF 90-k to the B input terminal of selector 88-(k+1) in the next bit stage (not visible), except that the Q output signal from D-FF 90-M in the last bit stage B2-M becomes the scan output signal (SCAN_OUT).

Capture operations are performed during cycles of the SHIFT_CK signal in which the CAPTURE_SEL signal is at the '1' logic level. If the u_back signal is at the '0' logic level, the Frontk data are captured: D-FF 90-1 latches the u_back signal ('0'), and D-FFs 90-k (2≦k≦M) latch the Frontk signals. If the u_back signal is at the '1' logic level, the Backk data are captured: D-FF 90-1 latches the u_back signal ('1'), and D-FFs 90-k (2≦k≦M) latch the Backk signals.

Shift operations are performed during cycles of the SHIFT_CK signal in which the CAPTURE_SEL signal is at the '0' logic level. In each SHIFT_CK cycle, the value held in each D-FF 90-k (1≦k≦M−1) is shifted into the next D-FF 90-(k+1). D-FF 90-1 receives and stores the SCAN_IN signal.

An update operation is performed when an UPDATE_CK pulse is supplied, causing D-FF 92-1 to latch the current contents of D-FF 90-1, and begin output of the latched logic level as the u_back signal.

An update reset operation is performed when the UPDATE_RST signal is driven to the '1' logic level, resetting the u_back signal to the '0' logic level. Only the first bit stage B2-1 responds to the UPDATE_CK and UPDATE_RST signals. The other bit stages B2-k (2≦k≦M) do not generate update data.

The operation of the scan register 86 in capturing and shifting out first the front capture data, then the back capture data, will be described below.

To capture and shift out the front capture data, first the u_back signal is set to the '0' logic level by input of an UPDATE_RST signal. Next, the SHIFT_CK signal is cycled M times. During the first SHIFT_CK cycle, the CAPTURE_SEL signal is placed at the '1' logic level, causing D-FF 90-1 to latch the '0' logic level of the u_back signal, and the other D-FFs 90-k (2≦k≦M) to latch the Frontk signals. During this first cycle of the SHIFT_CK signal, D-FF 90-M begins output of the FrontM signal as the SCAN_OUT signal. During the next M−1 SHIFT_CK clock cycles, the CAPTURE_SEL signal is held at the '0' logic level, causing the Frontk signals to be shifted as data through D-FFs 90-2 to 90-M and scanned out on the SCAN_OUT signal line. The M successive values of the SCAN_OUT signal are FrontM, Front(m−1), Front2, '0', the final '0' being the u_back logic level.

During the M-th SHIFT_CK cycle, the SCAN_IN signal is placed at the '1' logic level, which is latched by D-FF 90-1. Next, an update operation is performed, setting u_back to the '1' logic level.

The back capture data are now captured and shifted out in the manner described above, by cycling the SHIFT_CK signal M times, with CAPTURE_SEL at the '1' logic level during the first cycle and at the '0' logic level during the remaining M−1 cycles. The M successive values of the SCAN_OUT signal are BackM, Back(m−1), . . . , Back2, '1', the final '1' being the u_back logic level.

If necessary, the SCAN_IN signal can be placed at the '0' logic level during the M-th SHIFT_CK cycle to scan a '0' into D-FF 90-1, and an update operation can then be performed to reset u-back to the '0' logic level.

The above operations enable an M-bit scan register 86 to capture and scan out considerably more than M bits of parameter data or other data.

Figure 21:
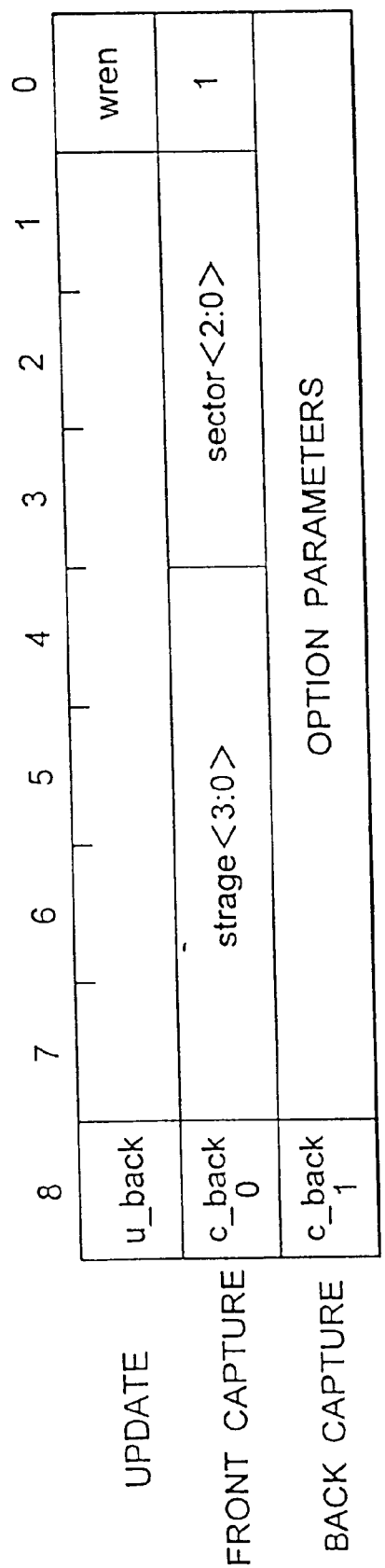
FIG. 21 shows the capture data and update data format of a profile register exemplifying the fourth embodiment.

This scan register 86 is particularly suitable for use in the first three embodiments as the profile register 28, which may need to capture a large amount of parameter data, but has to provide only one update data bit (wren). Referring to FIG. 21, a nine-bit scan register 86 can be used to capture a four-bit code (strage<3:0>) indicating the flash-memory storage capacity, a three-bit code (sector<2:0>) indicating the sector size, and eight bits of parameter data describing other options, such as the word width, as well as two flag bits (c_back0 and c_back1). The storage capacity and sector size may be coded as indicated in FIGS. 22 and 23, for example.

When this nine-bit scan register is used as the profile register, the least significant bit (bit 0) of update data (wren) is supplied to the control circuit 38 to enable or disable the generation of write pulses, as described in the first embodiment. The meaning of the most significant bit (bit 8) will be described later.

One alternative to the use of this nine-bit profile register would be to provide a single eighteen-bit profile register, but then eighteen SHIFT_CK cycles would be needed to access the least significant bit. In FIG. 21, any bit can be accessed in at most nine SHIFT_CK cycles.

Another alternative would be to provide two separate nine-bit profile registers, selected by different instruction codes or SCAN_BN codes. In this case, however, to obtain all of the capture data, two instruction codes or SCAN_BN codes would have to be scanned in and decoded to select both profile registers in turn. The fourth embodiment permits all of the capture data to be obtained after just one register selection operation.

The fourth embodiment thus has the advantage of providing efficient access to both large and small amounts of capture data. Another advantage of the fourth embodiment is that the circuit size of the scan register 86 is reduced, as compared with either of the two alternatives mentioned above.

In a variation of the fourth embodiment, additional sets of capture data are provided, and two or more update data bits are used to select a particular set of capture data. It suffices to provide D-FFs 92-k to latch update data in a plurality of bit stages B2-k, and use selectors 94-k with more data input terminals and selection-signal input terminals. A very large amount of capture data can thereby be obtained from a scan register with a comparatively small number of bit stages.

In another variation, one or more of the capture data bits can be output as updatable flag data. It suffices to add additional D-FFs 92-k to latch the flag bits as update data. In FIG. 21, for example, the most significant bit of capture data is used as a flag (c_back0 or c_back1).

For comparison with the embodiments above, a brief description will now be given of the conventional interface circuit, in which the memory-access registers are chained serially between the test data input and output terminals.

Figure 24:
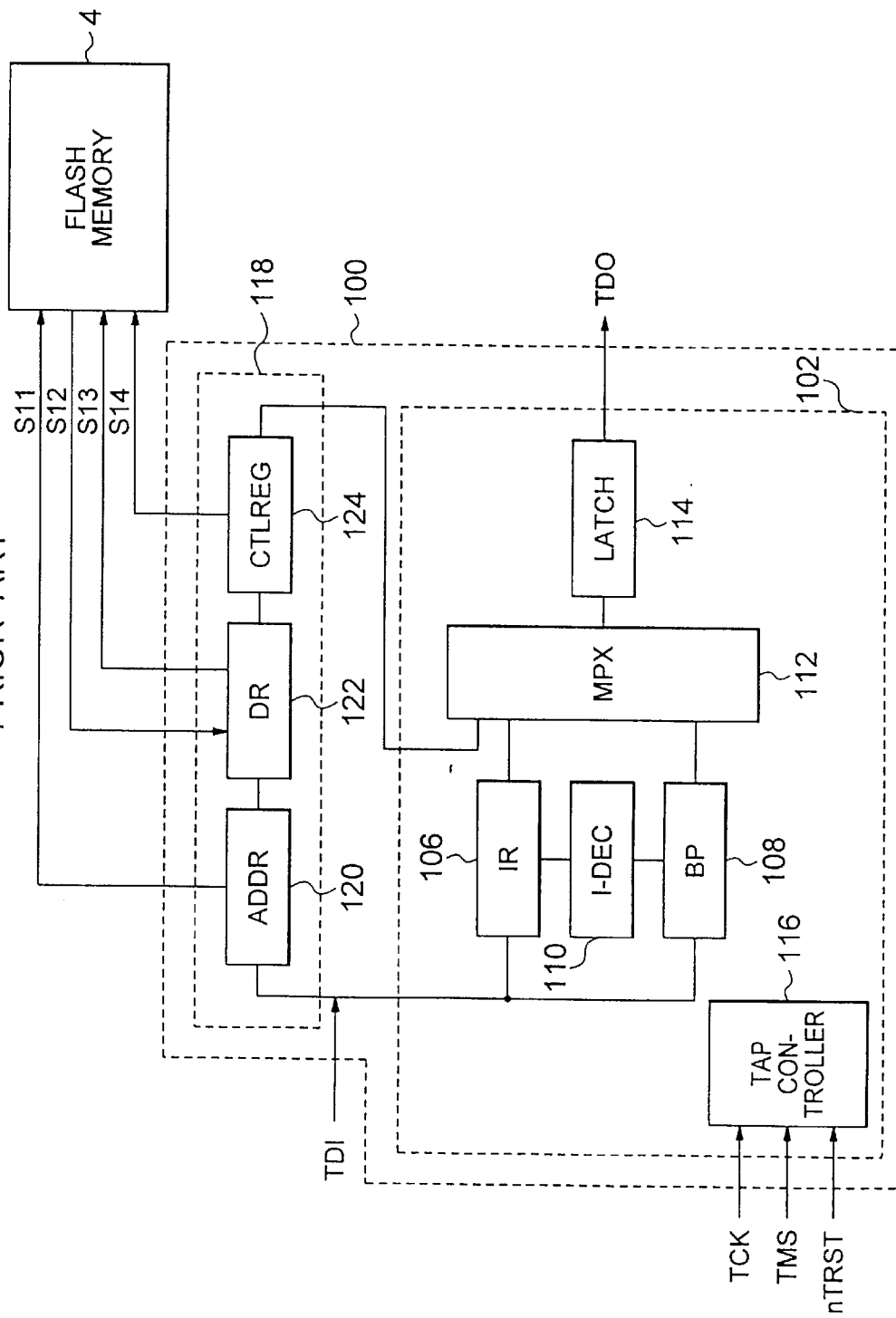
FIG. 24 is a block diagram illustrating a conventional interface circuit.

Referring to FIG. 24, the conventional interface circuit 100 provides a TAP circuit 102 generally similar to the TAP circuit in the second embodiment, comprising an instruction register 106, a bypass register 108, an instruction decoder 110, a multiplexer 112, a latch 114, and a TAP controller 116. There is also a memory-access register chain 118 comprising an address register (ADDR) 120, a data register (DR) 122, and a control register (CTLREG) 124, coupled in series between the TDI terminal and the multiplexer 112. The address register 120 supplies an address signal S11 as update data to the flash memory 4. The data register 122 receives read data S12 from the flash memory 4 as capture data, and supplies write data S13 to the flash memory 4 as update data. The control register 124 supplies a control signal 514 to the flash memory 4 as update data.

The memory-access register chain 118 is selected when an INTEST instruction code is scanned into the instruction register 106 and decoded. The three registers 120, 122, 124 in the chain 118 operate as if they were a single scan data register, shift operations and update operations being carried out on all three registers simultaneously.

When the flash memory 4 is programmed, for each word of write data, it is necessary to scan a control code, the data word, and an address into the register chain 118. Moreover, to generate write pulses that satisfy setup and hold time requirements with respect to the address and data, this scan operation must be repeated at least three times per word, changing the control code each time. The need for so much repeated scanning greatly delays the programming operation.

During read access, it is basically necessary to scan a control code into the control register 124, scan an address into the address register 120, perform an update operation to send control and address signals to the flash memory 4, perform a capture operation to capture the data output by the flash memory 4, and then scan the captured data out from the data register 122, through the control register 124. Thus read access is also greatly delayed, as compared with the present invention.

A further source of delay is that even when only a control code is scanned in, it must be shifted through the address register 120 and the data register 122 before it can reach the control register 124. Similarly, data scanned out from the data register 122 must pass through the control register 124 before reaching the test data output terminal TDO.

As explained above, the present invention provides access to flash memory data without the need for repeated scanning in of addresses and control codes, and enables Ad large amounts of flash-memory parameter data to be captured and scanned out.

The present invention can be practiced in any large-scale integrated circuit having a test access port of the general type described in the IEEE 1149.1 standard, regardless of whether or not the test access port is also used to implement boundary-scan functions or debugging functions. If these other functions are present, the TAP circuit may be shared with them. Alternatively, the TAP circuit in the interface circuit may be an independent unit, the boundary-scan functions and/or debugging functions being implemented by another TAP circuit.

The invention has been described in relation to the control protocol given in the IEEE 1149.1 standard, but is not limited to this protocol. Any protocol that enables capture, shift, and update operations to be carried out on the data scan registers in the memory-access register block can be employed. The controller in the interface circuit does not have to follow the state transitions shown in FIG. 7.

The invention is not limited to the use of a flash memory with a sector buffer. If the flash memory does not have a sector buffer, each word of write data can be programmed immediately after being transferred from the memory-access register block to the flash memory. In this case, the codes written in the function command register 34 and the control signals generated by the control circuit 38 will naturally differ from those described above, and the methods of generating write enable signals and word addresses may also differ.

The parameter information stored in the profile register is not limited to the storage capacity, sector size, and word width of the flash memory. Examples of other information that may be stored include information specifying electrical characteristics of the flash memory, information specifying flash memory access or programming methods, and information related to circuits other than the flash memory. If a large amount of parameter information must be stored, the profile register can be provided with multiple sets of capture data as described in the fourth embodiment. Needless to say, the profile register is not limited to the capture data format shown in FIG. 21. For example, the u back flag does not have to be the most significant bit of update data, but can be located in any bit location.

The invention is not limited to flash memory, but can be applied in relation to any type of embedded non-volatile memory to which external serial access might be necessary.

Those skilled in the art will recognize that further variations are possible within the scope claimed below.

What is claimed is:

1. A scan register receiving serial scan input data and parallel capture data, and providing output of serial scan output data and update data, comprising: a selector selecting among different sets of said parallel capture data according to at least one bit of the update data.

2. The scan register of claim 1, further comprising:
   a shift register selectively receiving said serial input data from the data input terminal and the parallel capture data selected by the selector, storing the selectively received data, and supplying the stored data as said serial output data; and
   a latch receiving at least part of the data stored in the shift register, and storing said at least part of the data as said update data.

3. The scan register of claim 2 wherein said at least one bit of the update data is also supplied to said shift register as part of said parallel capture data, when said shift register receives said parallel capture data selected by the selector.

* * * * *